United States Patent [19]

Kurakado et al.

[11] Patent Number: 5,321,276
[45] Date of Patent: Jun. 14, 1994

[54] RADIATION SENSING DEVICE AND JOSEPHSON DEVICE

[75] Inventors: Masahiko Kurakado; Atsuki Matsumura; Takeshi Kaminaga; Tooru Takahashi, all of Kanagawa, Japan

[73] Assignee: Nippon Steel Corporation, Tokyo, Japan

[21] Appl. No.: 770,447

[22] Filed: Oct. 1, 1991

Related U.S. Application Data

[63] Continuation-in-part of Ser. No. 454,149, Dec. 21, 1989, abandoned.

[30] Foreign Application Priority Data

Dec. 23, 1988 [JP] Japan .................. 63-323504
Sep. 5, 1989 [JP] Japan .................. 1-229547

[51] Int. Cl.⁵ .................. H01L 39/22; H01L 39/12; G01K 7/00
[52] U.S. Cl. .................. 257/32; 257/31; 257/35; 505/805; 505/806; 505/817; 505/848; 505/873; 505/922; 250/336.2
[58] Field of Search .................. 357/4, 5; 307/306; 505/843, 702, 832, 848, 849, 805, 806, 817, 873, 922; 250/336.2

[56] References Cited

U.S. PATENT DOCUMENTS

| | | | |
|---|---|---|---|
| 3,643,237 | 12/1972 | Anacker | 505/832 |
| 4,458,408 | 7/1984 | Latta et al. | 257/35 |
| 4,490,733 | 12/1984 | Kroger | 257/35 |
| 4,495,510 | 1/1985 | Roth et al. | 505/874 |
| 4,631,423 | 12/1986 | Faris . | |
| 4,814,598 | 3/1989 | Faris . | |
| 4,837,609 | 6/1989 | Gurvitch et al. | 357/5 |
| 4,869,598 | 9/1989 | McDonald . | |
| 4,970,395 | 11/1990 | Kruse, Jr. . | |

FOREIGN PATENT DOCUMENTS

| | | | |
|---|---|---|---|
| 0035350 | 9/1981 | European Pat. Off. | 257/31 |
| 102383 | 5/1988 | Japan | 357/5 |
| 64-11377 | 1/1989 | Japan . | |
| 122179 | 5/1989 | Japan | 357/5 |
| 138769 | 5/1989 | Japan | 357/5 |

OTHER PUBLICATIONS

Kenji Ishobashi et al.; "Possible Use of Bulk Superconductor with Tunnel Junctions for Nuclear Radiation Spectroscopy"; Nuclear Instruments and Methods in Physics Research 227 (1984), pp. 483–488.

N. E. Booth; "Quasiparticle Trapping and the Quasiparticle Multiplier"; Appl. Phys. Lett. 50 (5), Feb. 2, 1987; pp. 293–295.

(List continued on next page.)

Primary Examiner—William D. Larkins
Assistant Examiner—Alice W. Tang
Attorney, Agent, or Firm—Wenderoth, Lind & Ponack

[57] ABSTRACT

A superconducting tunnel junction radiation sensing device includes first and second superconductor electrodes and a tunnel barrier layer interposed therebetween. The tunnel barrier layer is made up of a thin-wall portion and a thick-wall portion each formed of a semiconductor or an insulator, and each having opposite surfaces respectively contacting the first and second superconductor electrodes, and each extending adjacent each other in a same horizontal plane between the first and second electrodes. The thick-wall portion has a vertical thickness which is at least twice that of the thin-wall portion. Furthermore, the thickness of the thin-wall portion is such that a tunnel effect is enabled therethrough form the first electrode to the second electrode, and the thickness of the thick-wall portion is such that a tunnel effect is substantially prohibited therethrough from the first electrode to the second electrode. The thin-wall portion along the same horizontal plane is substantially evenly distributed in a cross-sectional pattern within the tunnel barrier layer, the cross-sectional pattern being either an intermittent pattern or a continuous pattern. Furthermore, the crosssectional area along the same horizontal plane of the thin-wall portion is less than that of the thick-wall portion.

21 Claims, 15 Drawing Sheets

OTHER PUBLICATIONS

R. B. Laibowitz and J. J. Cuomo; "Tunneling Sandwich Structures Using Single-Crystal Niobium Films"; J. Appl. Phys. vol. 41, No. 6, May 1970; pp. 2748-2750.

Broom, "Niobium Tunnel Junction Fabrication" IBM Technical Disclosure Bulletin, vol. 20, No. 5, Oct. 1977, p. 1973.

Neauhauser et al., "Acoustic Detection of Single Particles for Neatrino Experiments and Dark Matter Searches", IEEE Trans. on Mag. vol. Mag-23, No. 2, Mar. 1987, pp. 469-472.

Masahiko Kuradado; "Nuclear Radiation Detection with Superconducting Tunnel Junctions"; Applied Physics, vol. 53, No. 6, pp. 532-537 (1984); partial translation.

Antonio Barone; "Superconductive Particle Detectors"; World Scientific; Oct. 26-29, 1987.

N. E. Booth; "Quasiparticle trapping and the quasiparticle multiplier"; Appl. Phys. Lett. 50(5), Feb. 2, 1987; pp. 293-295.

S. B. Kaplan et al.; "Quasiparticle and phonon lifetimes in superconductors"; Physical Review B, vol. 14, No. 11, Dec. 1, 1976; pp. 4854-4873.

J. Lumley et al.; "High Quality All Refractory Josephonson Tunnel Junctions for Squid Applications"; IEEE Transaction on Magnetic, vol. MAG-21, No. 2 pp. 539-542 (1985).

Kenji Ishibashi et al.; "Possible Use of Bulk Superconductor with Tunnel Junctions for Nuclear Radiation Spectroscopy"; Nuclear Instruments and Methods in Physics Research 227 (1984), pp. 483-488.

M. Kuradado; "Possibility of High Resolution Detectors Using Superconducting Tunnel Junctions"; Nuclear Instruments and Methods 196 (1982); pp. 275-277.

M. Kurakado; "Alpha-particle detection with superconductor detectors"; J. Appl. Phys. 55(8), Apr. 15, 1984; pp. 3185-3187.

K. Ishibashi et al.; "Characteristics of Nb-Based Josephson Junctions at a Temperature Below 1 K'"; IEEE Transactions on Magnetics, vol. 25, No. 2, Mar. 1989, pp. 1354-1357.

Tetsuya Takami; "Nb Series Superconducting Tunnel Junction Element"; Patent Abstracts of Japan, Mar. 5, 1987, vol. 11, No. 73 (E-486) [2520].

Masahiko Kurakado et al.; "X-Ray Detection with $Nb/AlO_x/Nb$ Superconductor Detectors"; Japanese Journal of Applied Physics, vol., 28, No. 3, Mar. 1989, pp. L459-L461.

Jurgen Niemeyer et al.; "Nb/Al-oxide/Nb and NbN/MgO/NbN Tunnel Junctions in Large Series Arrays for Voltage Standards"; Japanese Journal of Applied Physics vol. 25, No. 5, May 1986, pp. L343-L345.

Takeshi Imamura et al.; "A submicrometer $Nb/AlO_x/Nb$ Josephson junction"; J. Appl. Phys. 64(3), Aug. 1, 1988, pp. 1586-1588.

D. Twerenbold et al.; "Superconducting Sn/Sn-oxide/Sn tunneling junctions as high-resolution x-ray detectors"; IEEE Transactions on Magnetics; Mar. 1989; vol. 25; No. 2; pp. 1-7.

Masahiko Kurakado et al.; "$Nb/AlOAlO_x/Nb$ superconductor detector using a single-crystal Nb layer"; Applied Physics Letters, vol. 57, Oct. 29, 1990, No. 18, pp. 1933-1935.

M. G. Blamire et al.; "Extreme Critical-Temperature Enhancement of Al by Tunneling in $Nb/AlO_x/Al/AlO_x/Nb$ Tunnel Junctions"; Physical Review Letters, vol. 66, No. 2, Jan. 14, 1991, pp. 220-223.

Akira Shoji et al.; "New fabrication process for Josephson tunnel junctions with (niobium nitride, nobium) double-layered electrodes"; Appl. Phys. Lett. 41 (11), Dec. 1, 1982, pp. 1097-1099.

S. M. Sze; Physics of Semiconductor Devices-Second Edition; "Characterization of Barrier Height"; pp. 270-279.

Ching-Yuan Wu; "Barrier height reduction of the Schottky barrier diode using a thin highly doped surface layer"; J. Appl. Phys. 51(9), Sep. 1980, pp. 4919-4922.

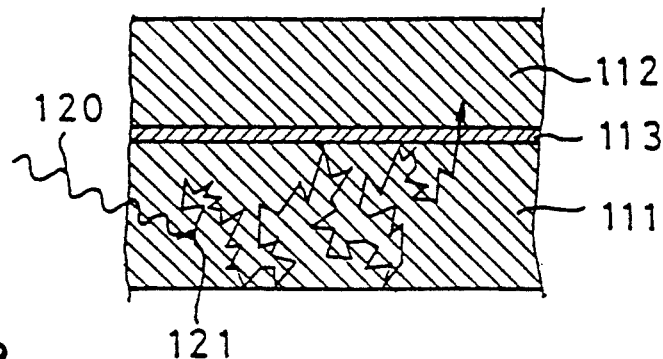
FIG. 27
PRIOR ART
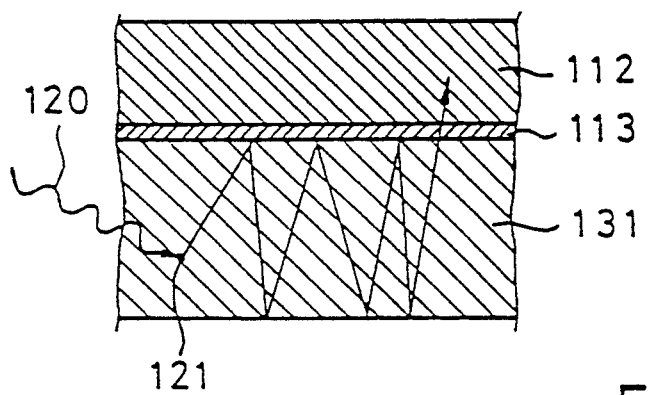
FIG. 28
PRIOR ART
FIG. 29
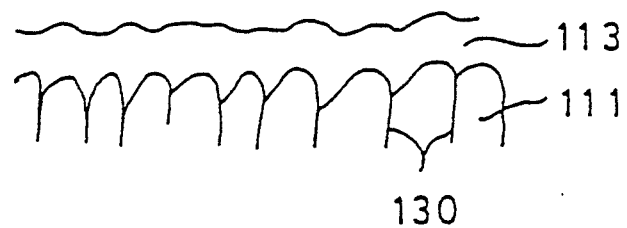
FIG. 30
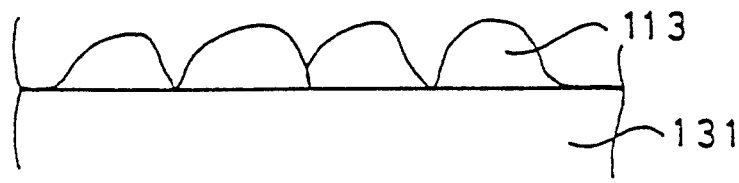

RADIATION SENSING DEVICE AND JOSEPHSON DEVICE

RELATED APPLICATION

This application is a continuation-in-part of copending U.S. patent application Ser. No. 07/454,149 filed on Dec. 21, 1989 by Masahiko Kurakado, Atsuki Matsumura, Takeshi Kaminaga and Tooru Takahashi, now abandoned.

BACKGROUND OF THE INVENTION

1. Field of the Invention

This invention relates to a radiation sensing device and a Josephson device. More particularly, this invention relates to a device for the detection of nuclear radiation, light energy, etc. using a superconducting tunnel junction, an arithmetic device, and a Josephson device as used for the detection of microwaves.

2. Description of the Prior Art

The radiation sensing device using a superconducting tunnel junction can possibly have more than a ten times greater energy-resolution than that of the conventional high-resolution semiconductor-detectors. The development of this radiation sensing device has been under way in recent years [Applied Physics, Vol. 53, No. 6, pages 532–537 (1984) and A. Barone "Superconductive Particle Detectors," (1988), World Scientific].

The common term "light" actually denotes an electromagnetic wave, similar to the X ray radiation. The photosensor using a superconducting tunnel junction may become highly sensitive to a wide spectrum of light i.e. light having wavelengths from the far-infrared to the ultraviolet spectrum.

Heretofore, for the detection of radiation energy such as X ray radiation and light energy, by the use of a superconducting tunnel junction, a device configured as illustrated in FIG. 23 and FIG. 24 has been developed.

In the sensing device illustrated in FIG. 23 and FIG. 24, a thin insulating layer (tunnel barrier layer) 113 is disposed throughout the entire junction between a superconductor 111 serving as a lower electrode and a superconductor 112 serving as a counter electrode and shaped so as to enclose the upper surface and one lateral surface of the superconductor 111 serving as the lower electrode. In FIG. 24, the reference numeral 127 denotes an upper wiring and the reference numeral 128 a lower wiring.

To improve the performance of the radiation sensing device or the photosensor, the surface area of the superconductor destined to serve as an absorbent for the radiation energy or photon energy must be increased for enhancing the detection efficiency of the impinging radiation or photons. In the device configured as illustrated in FIG. 23 and FIG. 24, such an increase in the surface area entails a problem in that the electric capacitance of the tunnel junction increases and the radiation or photon energy detection signal decreases.

Booth, for the purpose of solving this problem, has proposed a device having a vertical sectional structure as illustrated in FIG. 25 (Applied Physics Letters, Vol. 50, No. 5, pages 293–295 (1987)). Specifically, a superconducting tunnel junction device is produced having a lower electrode side superconductor 111 which is a composite having superposed on the central part of a large surface area of a superconductive layer 116 a superconductive layer 117 having a small surface area and having a smaller energy gap than the superconductive layer 116. An insulating layer 113 is formed on the upper surface of the superconductive layer 117, and superposed on the insulating layer 113 is a superconductor 112 which serves as a counter electrode. This device reduces the electric capacitance and provides for a large detection signal because the insulating layer 113 has a smaller surface area than the superconductive layer 116 serving as the absorbent of the radiation or photon energy. Further, since the superconductive layer 117 having a smaller energy gap than the superconductive layer 116 is joined to the insulating layer 113, the electrons or holes excited in the superconductive layer 116 by the absorption of radiation or photon energy 120 (hereinafter collectively referred to as "excited electrons" for the sake of simplicity) 121, after being diffused inside the superconductive layer 116 and then passed into the superconductive layer 117, are not appreciably returned again to the superconductive layer 116 but are instead contained within the superconductive layer 117. Since the superconductive layer 117 functions as a trapping layer and continues to trap the excited electrons close to the insulating layer 113, the probability that the excited electrons 121 will penetrate the insulating layer 113 by virtue of the tunnel effect and contribute to a single before recombination is improved.

In the device of such a structure as illustrated in FIG. 25 and as proposed by Booth, the efficiency of the collection of the excited electrons in the superconductive layer 117 is high when the mean free path of the excited electrons within the superconductive layer 116 is not very small as compared with the representative length of the plane of the superconductive layer 116 (such as, for example, the diameter where the plane has a circular shape or the length of the side where the plane has a square shape). Generally, however, it is quite difficult to increase the mean free path of excited electrons within a superconductor beyond the level of some tens of $\mu m$. Even if the mean free path could be sufficiently increased in a superconductor having a bulky form, once the superconductor is finished in the form of a thin film, the mean free path is substantially limited by the thickness of the thin film. Thus, it is impossible to approximate the mean free path to the representative length of the plane of the superconductive layer 116 in the case of thin film detectors.

In the structure illustrated in FIG. 25, since the surface area of the superconductive layer 117 destined to serve as a trapping layer is smaller than that of the superconductive layer 116 destined to serve as an absorbent of energy, it is inferred that the excited electrons 121 produced as a consequence of the absorption of radiation or photon energy 120 in a portion of the superconductive layer 116 remote from the superconductive layer 117 require a much longer time to reach the superconductive layer 117 by diffusion than those produced in a portion relatively close to the superconductive layer 117 as illustrated in FIG. 26. In fact, it is well known that the average time required for the excited electrons 121 to depart from a certain point to a certain distance by diffusion is proportional to the square of this distance. It is also well known that in a superconductor, the electrons excited by radiation or photon energy eventually recombine (S. B. Kaplan et al, Physical Review B., Vol. 14, pages 4,854–4,873 (1976)). In the tunnel junction device, the excited electrons no longer contribute to detection signals when they recombine before they penetrate the insulating layer by virtue of the tunnel effect. Thus, even when the radiation or photon energy is constant, the rise time and magnitude of the detection signal varies according to the location of the impingement of the radiation or photon energy. Further, concerning the electrons excited in the portion 116 close to the superconductive layer 117, many of the excited electrons diffuse to the portion of the superconductive layer 116 remote from the superconductive layer 117 before they reach the superconductor layer 117.

In the device structure of FIG. 25, when the surface areas of the insulating layer 113 and that of the superconductor 112 are fixed and the surface area of the superconductive layer 117 is enlarged so as to equal that of the superconductive layer 116, the average time required for the electrons excited within the superconductive layer 116 to be diffused in the superconductive layer 117 is decreased. In this case, however, the time required by the excited electrons in traveling from the superconductive layer 117 of a larger surface area to the insulating layer 113 of a smaller surface area is increased and, as the result, the probability that they will recombine before they penetrate the insulating layer 113 by virtue of the tunnel effect increases.

The conventional radiation sensing device is disadvantageous in that a generous increase in the surface area for the enhancement of the efficiency of detection is difficult to obtain, in that a large increase in the surface area results in a decrease in the response speed, and in that the rise time and magnitude of the detection signal varies according to the location of the impingement of the radiation or photon energy.

Further, in the radiation sensing device or the photosensor, it is considered that an increase in the thickness of the superconductor serving as an energy absorbent is effective in enhancing the detection efficiency of radiation or light energy.

It is plain from the above description that in order for the radiation sensing device or the photosensor to be highly sensitive, however, the excited electrons produced in the sensor by the impingement of radiation or photon energy must efficiently pass through the tunnel barrier layer by virtue of the tunnel effect and then output from the junction in the form of signal charges. If the excited electrons require a long time period in tunneling the barrier layer, most of the excited electrons will recombine in this time period and are thus not output in the form of signal charges.

When the thickness of the superconductor is increased for the purpose of improving the detection efficiency of the radiation or light energy and, as the result, the time required by the excited electrons in tunneling the tunnel barrier layer increases, there ensues a disadvantage in that the collection efficiency of the excited electrons is degraded.

In fact, in the conventional radiation sensing device, the energy resolution is seriously degraded by an increase in the thickness of the superconductive layer alone. This phenomenon is ascribable in a large measure to the fact the conventional radiation sensing device configured as illustrated in FIGS. 23 and 24 or FIGS. 25 and 26 utilizes superconductors formed invariably of polycrystals.

Specifically, in order for the excited electrons 121 produced in response to the incident radiation or photon energy 120 to achieve efficient tunneling through the tunnel barrier layer 113, it is desirable that the excited electrons 121 be capable of quickly migrating about within the superconductive layer and easily reaching the tunnel barrier layer. As easily understood from FIG. 27 and FIG. 28 which, depict the manner of diffusion of excited electrons 121, it is desirable that the superconductive layer on which the radiation or photon 120 impinges not be the polycrystalline superconductor 111 but instead be a single-crystal superconductor 131 in which the mean free path of excited electrons 121 is long. Incidentally, this fact has been pointed out in literature (Nuclear Instruments and Method in Physics Research, Vol. 277, P 483 (1984)).

Forming the energy absorbent superconductor of the single-crystal superconductor 131, therefore, is advantageous for enhancing the collection efficiency of the excited electrons. In a device as illustrated in FIG. 28 which is formed using a single-crystal superconductor 131 as a lower superconductive layer and superposing thereon a tunnel barrier layer 113 and an upper superconductive layer 112, there arises a disadvantage in that there is an increase in the leak current, i.e. the electric current which flows through defects in the tunnel barrier layer 131 or in the terminal of the tunnel barrier layer 113. The leak current itself constitutes a major source of electric noise. For the radiation sensing device which measures individual components of radiation or light energy from weak signal charges, this drawback is fatal.

The superconducting tunnel junction type radiation sensing device relies on excited electrons as already described and not on the Josephson effect. The operating principle and the method of use of this radiation sensing device are entirely different from those of the microwave sensor using a Josephson junction, for example. In fact, the radiation sensing device as used is maintained under a magnetic field for the purpose of suppressing the Josephson effect. The wiring for this device also necessitates a peculiar construction which is not required in the Josephson junction. Exclusively in terms of the basic configuration of the junction, however, the superconducting tunnel junction device and the tunnel type Josephson junction are substantially identical to each other.

Heretofore, in the tunnel type Josephson device, polycrystalline superconductors have also been used as superconductors. In a device which uses polycrystalline superconductors only as superconductors, however, when the temperature above the transition temperature is lowered below that temperature in a weak magnetic field, such as in geomagnetism, the superconductor is not easily cooled evenly or uniformly in one direction because of the numerous grain boundaries present in the polycrystalline. Thus, there ensues the possibility that the magnetic field which has been expelled by the Meissner effect from a location already vested with superconductivity is trapped in a location not yet vested with superconductivity and the magnetic flux is consequently trapped in the device (magnetic flux trap). Since the occurrence of the magnetic flux trap depends on a delicate change in the manner of cooling occurring in the device, it cannot be easily controlled.

When magnetic flux is trapped, the Josephson device cannot achieve an optimum operation because the DC Josephson current decreases.

For the elimination of this problem, the use of single crystals as a superconductor layer has been tried in the tunnel type Josephson device (IEEE Transactions on Magnetic, Vol. MAG-21, No. 2, p 539 (1985)).

In the tunnel type Josephson device which uses single crystals as superconductors on the input side, it is considered that the magnetic flux trap does not easily occur because the device is liable to be cooled even or uniformly in one direction and, as the result, the magnetic flux is completely expelled from the device. Where the Josephson device is formed as illustrated in FIG. 28 by using a single-crystal superconductor 131 as a lower superconductive layer and superposing thereon a tunnel barrier layer 113 and an upper superconductive layer 112, there inevitably ensues a disadvantage in that there is an increase in the leak current, i.e. the electric current which flows through the defects in the tunnel barrier layer 113 or in the terminal part of the tunnel barrier layer 113, similar to the aforementioned radiation sensing device. Even in the Josephson device, the leak current poses a serious problem in that the probability of the device producing an erroneous operation will be increased.

SUMMARY OF THE INVENTION

An object of this invention, therefore, is to provide a novel radiation sensing device and a Josephson device which are free from the problems of the prior art mentioned above.

Another object of this invention is to provide a radiation sensing device using a superconducting tunnel junction adapted to maximize the surface area of the superconductor destined to serve as an absorbent for the radiation or photon energy.

Yet another object of this invention is to provide a radiation sensing device using a superconducting tunnel junction possessing a small electric capacitance and exhibiting a high radiation or photon energy detection efficiency.

Still another object of this invention is to provide a radiation sensing device using a superconducting tunnel junction having a high collection efficiency of excited electrons, having only a small leak current, and manifesting a high energy-resolution.

A further object of this invention is to provide a tunnel type Josephson device incapable of readily causing magnetic flux trap.

To accomplish the various objects described above, the first embodiment of this invention concerns a superconducting tunnel junction radiation sensing device including a superconductor-tunnel barrier-superconductor structure, namely, having first and second superconductor electrodes and a tunnel barrier layer interposed between the first and second superconductor electrodes, wherein the tunnel barrier layer comprises a thin-wall portion and a thick-wall portion each having opposite first and second surfaces respectively contacting the first and second electrodes and each extending adjacent each other in a same horizontal plane between the first and second electrodes;

the thick-wall portion having a vertical thickness extending from the first surface thereof to the second surface thereof which is at least twice that of the thin-wall portion;

the vertical thickness of the thin-wall portion being 5 to 100 Å;

the vertical thickness of the thin-wall portion being such that a tunnel effect is enabled therethrough from the first electrode to the second electrode, the vertical thickness of the thick-wall portion being such that a tunnel effect is substantially prohibited therethrough from the first superconductor electrode to the second superconductor electrode and such that an electric capacitance per unit area of the thick-wall portion is less than that of the thin-wall portion;

wherein the thin-wall portion along the same horizontal plane is substantially evenly distributed in a cross-sectional pattern within the tunnel barrier layer, the cross-sectional pattern being one of an intermittent pattern and a continuous pattern, and wherein a total cross-sectional area along the same horizontal plane of the thin-wall portion is less than that of the thick-wall portion.

The first embodiment of this invention is similarly applicable to a superconducting tunnel junction radiation sensing device which includes a superconductor-tunnel barrier-semiconductor structure.

To accomplish the various objects described above, the second embodiment of this invention concerns a superconducting tunnel junction radiation sensing device including a superconductor-tunnel barrier-superconductor structure, wherein the superconducting tunnel junction is formed by sequentially superposing a lower single-crystal superconductive layer, a polycrystalline superconductive layer of a vertical thickness not less than 3 Å and not more than one half the thickness of the lower single-crystal superconductive layer, a tunnel barrier layer made of a material which is not an oxide of a material of the polycrystalline superconductive layer, and an upper superconductive layer.

The second embodiment of this invention is similarly applicable to a superconducting tunnel junction radiation sensing device which includes a superconductor-tunnel barrier-semiconductor structure.

To accomplish the various objects described above, the third embodiment of this invention concerns a superconducting tunnel junction radiation sensing device having first and second superconductor electrodes and a tunnel barrier layer interposed between the first and second superconductor electrodes, wherein the tunnel barrier layer comprises a thin-wall portion and a thick-wall portion each having opposite first and second surfaces respectively contacting the first and second electrodes and each extending adjacent each other in a same horizontal plane between the first and second electrodes;

the thick-wall portion having a vertical thickness extending from the first surface thereof to the second surface thereof which is at least twice that of the thin-wall portion;

the vertical thickness of the thin-wall portion being 5 to 100 Å;

the vertical thickness of the thin-wall portion being such that a tunnel effect is enabled therethrough from the first electrode to the second electrode, the vertical thickness of the thick-wall portion being such that a tunnel effect is substantially prohibited therethrough from the first superconductor electrode to the second superconductor electrode and such that an electric capacitance per unit area of the thick-wall portion is less than that of the thin-wall portion;

wherein the thin-wall portion along the same horizontal plane is substantially evenly distributed in a cross-sectional pattern within the tunnel barrier layer, the cross-sectional pattern being one of an intermittent pattern and a continuous pattern, and wherein a total cross-sectional area along the same horizontal plane of the thin-wall portion is less than that of the thick-wall portion;

the first superconductor electrode comprising a polycrystalline superconductive layer formed along at least the first surface of the thin-wall part, and a single-crystal superconductive layer formed along at least the polycrystalline superconductive layer;

the polycrystalline superconductive layer having a vertical thickness in a direction perpendicular to the same horizontal plane which is not less than 3 Å and not more than one half the vertical thickness of the lower single-crystal superconductive layer;

wherein the thin-wall portion is formed of a substance which is not an oxide of the polycrystalline superconductive layer.

The third embodiment of this invention is similarly applicable to a superconducting tunnel junction radiation sensing device including a superconductor-tunnel barrier-semiconductor structure.

To accomplish the various objects described above, the fourth embodiment of this invention concerns a tunnel type Josephson device including a superconductor-tunnel barrier-superconductor structure, wherein the Josephson device is formed by sequentially superposing a lower single-crystal superconductive layer having opposite first and second surfaces and having a thickness extending from the first surface to the second surface which is greater than a London penetration depth of a material which forms the lower single-crystal superconductive layer;

a polycrystalline superconductive layer formed on the first surface of the lower single-crystal superconductive layer;

a tunnel barrier layer formed on the polycrystalline superconductive layer opposite the lower single-crystal superconductive layer, the tunnel barrier layer being formed of a material which is not an oxide of a material which forms the polycrystalline superconductive layer; and, an upper superconductive layer formed on the tunnel barrier layer opposite the polycrystalline superconductive layer.

According to the first embodiment of this invention, since a cross-sectional area along the same horizontal plane of the thin-wall portion is less than that of the thick-wall portion, the increase in the electric capacitance due to an increase in the area of device can be restrained. Further, according to this invention, since the thin-wall portion within the thick-wall portion along the same horizontal plane is substantially evenly distributed in a cross-sectional pattern, the distance from the position of excitation of electrons in the superconductive layer to the thin-wall portion of the tunnel barrier layer can be restrained within a sufficiently fixed range without reference to the position of excitation within the superconductor.

The inventors of the present invention have conducted a diligent study with a view to elucidating the cause for a large leak current possibly suffered by a device having a tunnel junction formed by directly superposing a tunnel barrier layer and an upper superconductive layer on a single-crystal superconductor as described above. The inventors have consequently drawn as an inference that the large leak current is ascribable to the fact that an attempt to form a tunnel barrier layer on a single-crystal superconductor is liable to produce a film lacking uniformity and abounding with pinholes as described more specifically hereinafter. The inventors have found that a tunnel junction structure suffering from only a small leak current and exhibiting a highly satisfactory performance is obtained by forming a polycrystalline superconductive layer of a small thickness on a single-crystal superconductive layer and further superposing thereon a tunnel barrier layer and an upper superconductive layer. The radiation sensing device consequently produced, i.e., the device according to the second embodiment of this invention, therefore, combines the highly satisfactory quality of a restrained leak current with the high collection efficiency of excited electrons as signal charges by virtue of the long mean free path of excited electrons in the single-crystal superconductive layer. By the same token, the Josephson device likewise produced, i.e., the Josephson device according to the forth embodiment of this invention, combines the highly satisfactory quality of a restrained leak current with the restraint imposed on the occurrence of a magnetic flux trap due to the use of the single-crystal superconductor.

The radiation sensing device according to the third and most preferred embodiment of this invention fulfills the requirements for both the first embodiment and the second embodiment described above. Thus, it will be naturally understood that such a device enjoys still better properties.

BRIEF DESCRIPTION OF THE DRAWINGS

FIG. 27 is a fragmentary vertical section view typically illustrating the state of diffusion of excited electrons in the conventional device shown in FIG. 23;

FIG. 28 is a fragmentary vertical section view typically illustrating the state of diffusion of excited electrons in the conventional device using a single-crystal superconductor;

FIG. 29 is an enlarged vertical section view typically illustrating the state of a tunnel barrier layer formed on a polycrystalline superconductor;

FIG. 30 is an enlarged vertical section view typically illustrating the state of a tunnel barrier layer formed on a single-crystal superconductor;

FIG. 31a representing a junction where the Al-AlO$_x$ layer and the upper polycrystalline Nb layer are formed by spattering and FIG. 31b representing a junction where the Al-AlO$_x$ layer and the upper polycrystalline Nb layer are formed by vacuum evaporation;

DETAILED DESCRIPTION OF THE INVENTION

Now, the present invention will be described in detail below with reference to the accompanying drawings.

Figure 1:
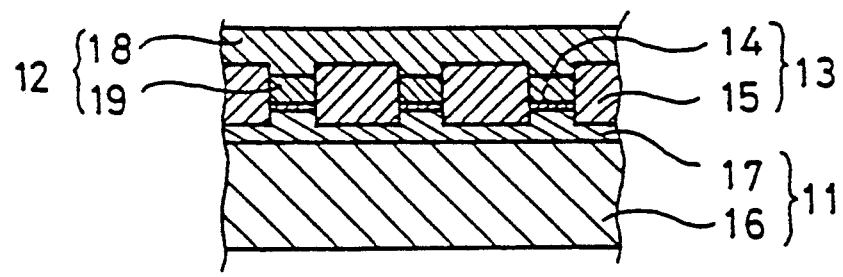
FIG. 1 is a fragmentary vertical section view illustrating a typical structure of the first radiation sensing device of this invention.
Figure 2:
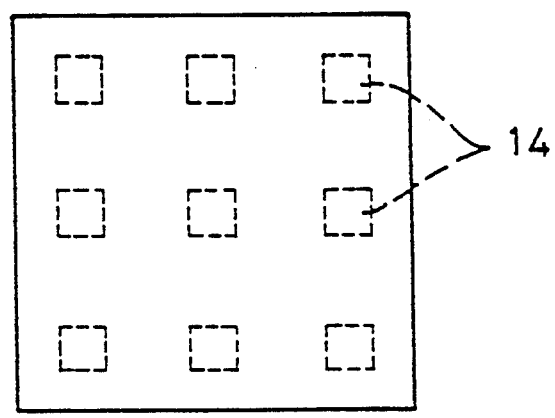
FIG. 2 is a plan view of the same structure.

FIG. 1 is a fragmentary vertical section view illustrating a typical structure of the radiation sensing device according to the first embodiment of this invention and FIG. 2 is a plan view of the same structure.

The radiation sensing device illustrated in FIG. 1 and FIG. 2 has a superconductor 11 destined to serve as a lower electrode, a superconductor 12 destined to serve as a counter electrode and a tunnel barrier layer 13 interposed between the lower superconductor electrodes 11 and the counter superconductor electrodes 12. The tunnel barrier layer 13 exists throughout the entire junction surface between the electrodes 11 and 12. The tunnel barrier layer 13 is composed of thin-wall portions 14 made of a thin insulator or semiconductor and a thick-wall portion 15 made of a thick insulator or semiconductor. The thin-wall portions 14 and the thick-wall portion 15 each have opposite first and second surfaces respectively contacting the lower and counter electrodes 11, 12 and each extend adjacent each other in a same horizontal plane between the lower and counter electrodes 11, 12.

The thick-wall portion 15 in the tunnel barrier layer 13 has a thickness extending from the first surface thereof to the second surface thereof which is at least twice, preferably at least five times, that of the thin-wall portions 14. The reason for this lower limit of thickness is that the electric capacitance per unit area of the thick-wall portion 15 does not differ distinctly from that of the thin-wall portions 14 and the merit of the provision of the thick-wall portion 15 is not acquired when the thickness is not up to twice that of the thin-wall portions 14.

The thickness of the thin-wall portions 14 of the tunnel barrier layer 13 is in the range of 5 to 100 Å, preferably 5 to 30 Å, where the portions 14 are made of an insulator, or in the range of 5 to 1,000 Å, preferably 10 to 100 Å, where the portions 14 are made of a semiconductor. The reason for this specific range of thickness is that the thin-wall portion 14 is not easily produced with substantial uniformity when the thickness of the thin-wall portion is less than the lower limit of the range and the passage of electrons by virtue of the tunnel effect is not obtained in the thin-wall portion 14 when the thickness exceeds the upper limit of the range.

A total cross-sectional area along the horizontal same plane of the thin-wall portions 14 is less than that of the thick-wall portion 15. The reason for this requirement is that, in the radiation sensing device according to the first embodiment of this invention, if the total cross-sectional area of the thin-wall portions 14 was larger than that of the thick-wall portion 15, the electric capacitance of the device would be larger than one half of that of a device whose tunnel barrier layer is made solely of a thin insulator or semiconductor and, therefore, the advantage otherwise acquired by providing the tunnel barrier layer 13 with the thin-wall portion 14 and the thick-wall portion 15 in precluding the electric capacitance from being increased as a consequence of an increase in the area would not be produced.

Figure 4:
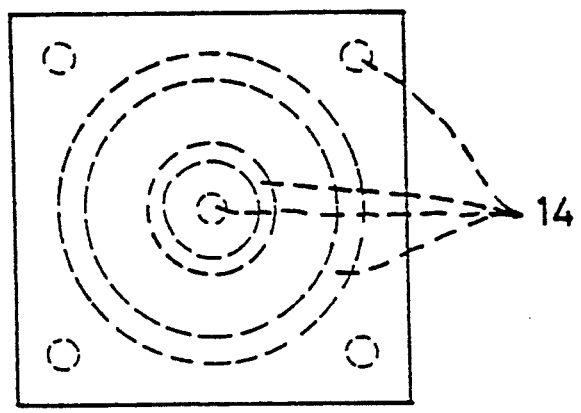
FIGS. 4 to 6 are plan views illustrating other typical structures of the first radiation sensing device of this invention.
Figure 5:
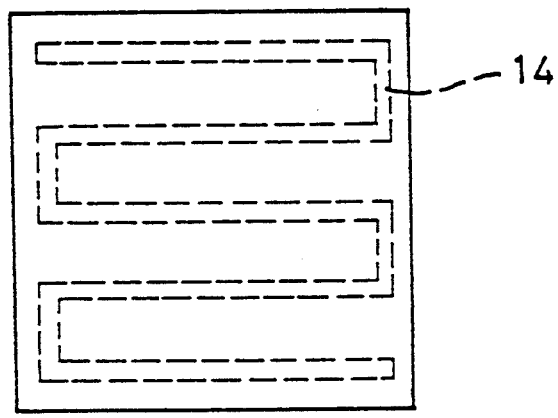
Figure 6:
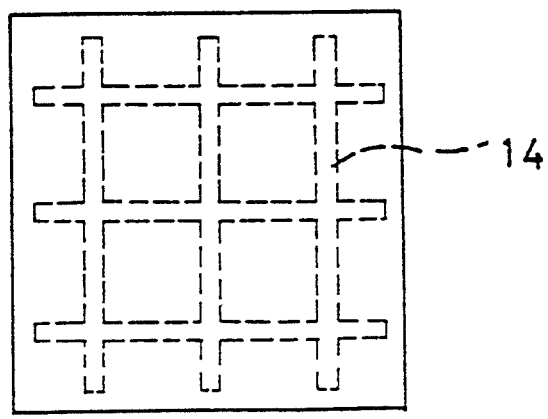

In the typical structure illustrated in FIGS. 1 and 2, the cross-sectional pattern along the same horizontal plane of thin-wall portions 14 is a plurality of small square segments which are substantially evenly dispersed in a large square of the whole tunnel barrier layer 13. Although the radiation sensing device according to the first embodiment of this invention is required to have the thin-wall portion 14 to be substantially evenly distributed within the tunnel barrier layer 13 along the same horizontal plane, the cross-sectional pattern of the thin-wall portion 14 is not limited to that which is illustrated in FIG. 2. The cross-sectional pattern may be one of any intermittent patterns and continuous patterns so long as the distances from all arbitrary points of the occurrence of electron excitation on the superconductor 11 (or the superconductor 12) to the nearest points of the thin-wall portion 14 fall within a desired range. For example, the thin wall portion 14 may be disposed in any of the horizontal cross-sectional patterns illustrated in FIGS. 4 to 6.

Further, in this respect, the condition set forth in the following expression is desired to be fulfilled:

$$0 < l < (\sqrt{S} - \sqrt{S_1})/\sqrt{\pi}$$

wherein S denotes a total combined cross-sectional area in the same plane horizontal of the thin-wall portion 14 and the thick-wall portion 15, wherein $S_1$ denotes a total cross-sectional area in the same horizontal plane of the thin-wall portion 14, and wherein l denotes a maximum value of a plurality of distances, the plurality of distances being the shortest linear distances in the same plane from all arbitrary points on the thick-wall portion 15 to the thin-wall portion 14.

Figure 38:
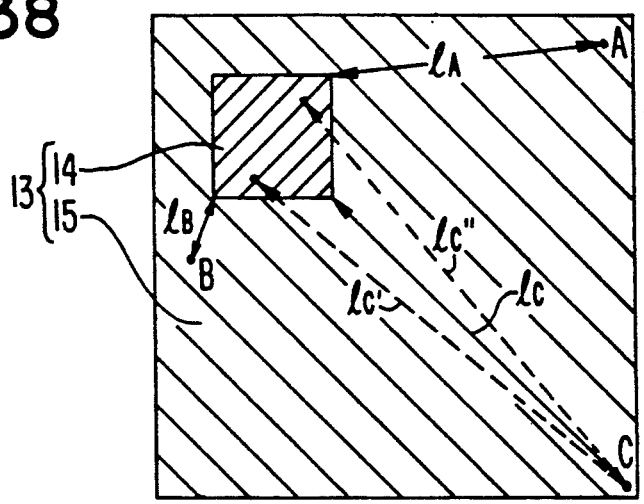
FIG. 38 is a cross section view along a horizontal plane between lower and counter superconductor electrode of the device illustrating a referential structure for the first radiation sensing device of this invention.
Figure 39:
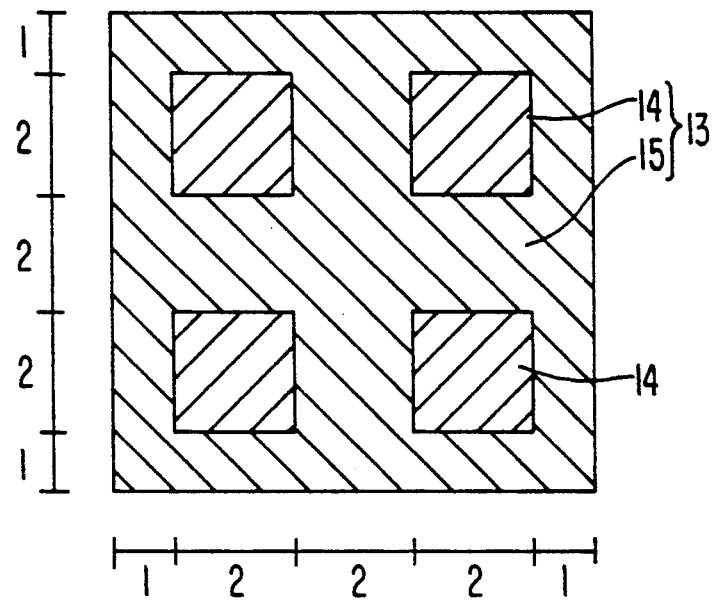
FIG. 39 is a cross section view along a horizontal plane between lower and counter superconductor electrode of the device illustrating a structure of the first radiation sensing device of this invention.
Figure 40:
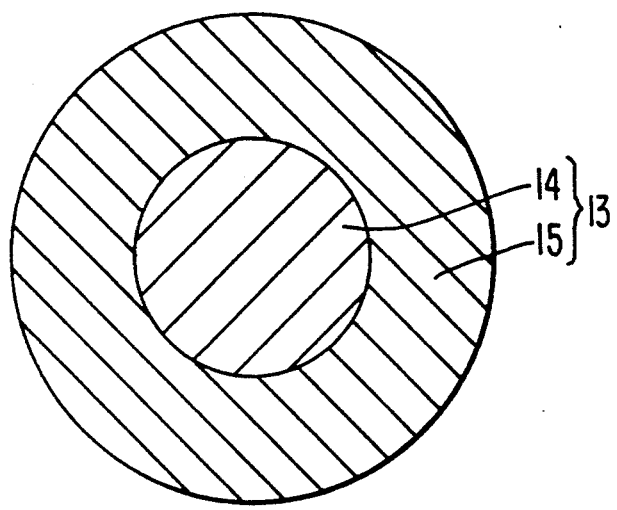
FIG. 40 is a cross section view along a horizontal plane between lower and counter superconductor electrode of the device illustrating a referential structure for the first radiation sensing device of this invention.

For illustrating this specific condition, FIGS. 38 to 40 are given. In FIG. 38, $l_A$ denotes the shortest linear distance from a point A on the thick-wall portion 15 to the thin-wall portion 14, similarly, $l_B$ the shortest linear distance from a point B, and $l_C$ the shortest linear distance from a point C. $l'_C$ and $l''_C$ do not denote the shortest linear distance from the point C to the thin-wall portion 14. In this case, $l_B < l_A < l_C$, therefore, the maximum value of the plurality of the shortest linear distances l is $l_C$. Of course, this case does not meet the above condition, since in this case $l > (\sqrt{S} - \sqrt{S_1})/\sqrt{\pi}$.

FIG. 39 is a cross-sectional pattern along the same plane of the thin-wall portion 14 in the tunnel barrier layer 13 of the radiation sensing device according to the first embodiment of this invention. In this case, $l = \sqrt{2}$, $\sqrt{S} = 8$, and $\sqrt{S_1} = 4$. So, $l = 1.414$, and $(\sqrt{S} - \sqrt{S_1})/\sqrt{\pi} = 2.256$. Thus, this case fulfills above specific condition, $0 < l < (\sqrt{S} - \sqrt{S_1})/\sqrt{\pi}$.

FIG. 40 depicts a cross-sectional pattern which falls just out of the boundaries of above specific condition. Namely, this case fulfills a condition, $l = (\sqrt{S} - \sqrt{S_1})/\sqrt{\pi}$. In this case, the thin-wall portion 14 having the total cross-sectional area of $S_1$ is disposed in the form of one circular figure at the center of the tunnel barrier layer 13 of a circular figure having the total combined cross-sectional area of S. Therefore, the thin-wall layer 14 under the condition, $l \geq (\sqrt{S} - \sqrt{S_1})/\sqrt{\pi}$, can hardly be considered as being substantially evenly distributed in the tunnel barrier layer 13. In this respect, the conditions set forth in the following expression are more desirable:

$$0 < l < (\sqrt{S} - \sqrt{S_1})/\sqrt{2\pi}, \text{ and } L_1 \geq L$$

wherein L stands for a total outermost edge length of the tunnel barrier layer 13 in a cross-section along the same horizontal plane, and $L_1$ for the total edge length of the thin-wall portion 14 in the cross-section. In the case of FIG. 39, $l = 1.44$, $(\sqrt{S} - \sqrt{S_1})/\sqrt{2\pi} = 1.56$, $L = 32$, and $L_1 = 32$. Thus, this case fulfills above desirable conditions, $0 < l < (\sqrt{S} - \sqrt{S_1})/\sqrt{2\pi}$ and $L_1 \geq L$. Furthermore, the conditions set forth in the following expression are most desirable:

$$0 < l < (\sqrt{S} - \sqrt{S_1})/2\sqrt{\pi}, \text{ and } L_1 \geq L$$

In the radiation sensing device of the typical structure illustrated in FIGS. 1 and 2, the superconductor 11 and the superconductor 12 are each depicted as a laminated structure composed of two layers. Specifically, the superconductor 11 includes a first superconductive layer 16 located along the outer side and a second superconductive layer 17 having a smaller energy gap than the first superconductive layer 16 and located along the inner side relative to the tunnel barrier layer 13. The superconductor 12 likewise includes a first superconductive layer 18 located along the outer side and a second superconductive layer 19 having a smaller energy gap than the first superconductive layer 18 and located along the inner side relative to the tunnel barrier layer 13. The fact that, in the radiation sensing device according to the first embodiment of this invention, the superconductors are each formed by having at least two superconductive layers having different energy gap magnitudes superposed in such a manner that the magnitudes of energy gap decreases as the distances of the superconductive layers from the tunnel barrier layer decreases is desirable from the standpoint of enhancing the efficiency of the collection of excited electrons in the thin-wall portion 14 of the tunnel barrier layer 13 by virtue of the trap effect. The excited electrons produced in the outer superconductive layer as a consequence of the absorption of radiation or photon energy are diffused inside the outer superconductive layer and passed into the inner superconductive layer and then, due to the large difference in energy gap, are trapped within the inner superconductive layer without being appreciably returned back to the outer superconductive layer and are continuously trapped near the thin-wall portion 14 of the tunnel barrier layer 13.

Figure 7:
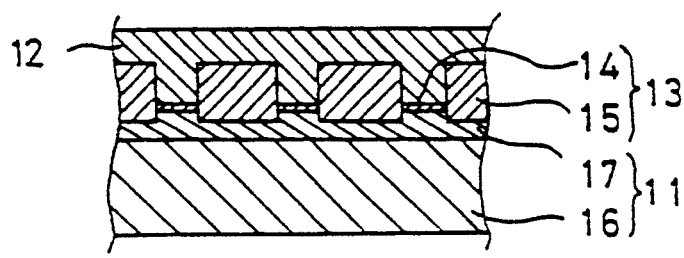
FIGS. 7 to 10 are fragmentary vertical section views illustrating still other typical structures of the first radiation sensing device of this invention.
Figure 8:
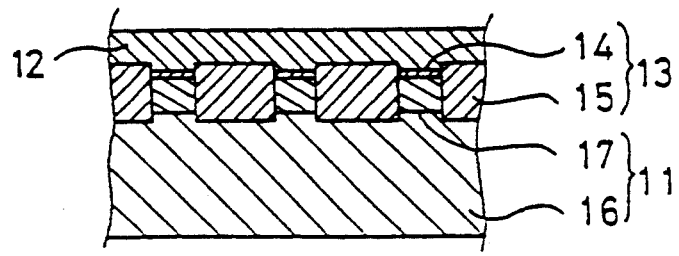
Figure 9:
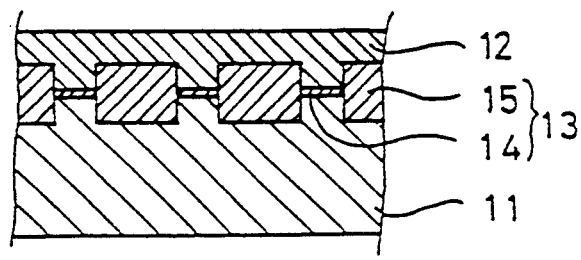
Figure 10:
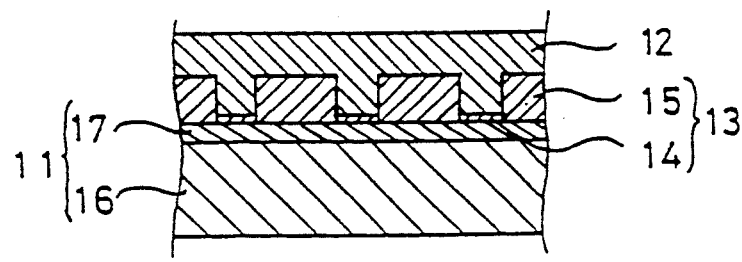

In the radiation sensing device of this invention, however, both of the superconductors 11 and 12 in the superconductor-tunnel barrier-superconductor structure are not required to be formed in a laminated structure as in the typical structure illustrated in FIGS. 1 and 2. For example, the one superconductor 11 may alone be formed in a superposed structure (consisting of the first superconductive layer 16 possessing a large energy gap and positioned on the outer side and the second superconductive layer 17 having a small energy gap and positioned on the inner side relative to the tunnel barrier layer 13) and the other superconductor 12 may be formed in a single-layer structure as in the structure illustrated in FIGS. 7, 8, and 10. Furthermore, both of the superconductors 11 and 12 may each be formed in a single layer structure as in the structure illustrated in FIG. 9. In the radiation sensing device according to the first embodiment of this invention, it is exclusively through the thin-wall portion 14 of the tunnel barrier layer 13 that the excited electrons are passed by virtue of the tunnel effect. When the superconductor 11 (or the superconductor 12) assumes such a laminated structure as described above, an extremely high trap effect is obtained even when the second superconductive layer 17 is formed only in the portion contiguous to the thin-wall portion 14 as in the structure illustrated in FIG. 8.

Figure 3:
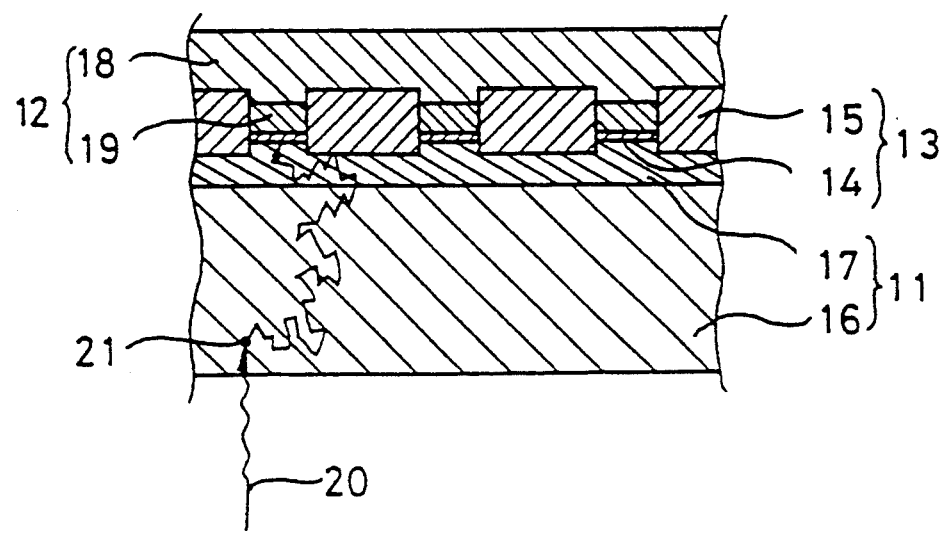
FIG. 3 is a fragmentary vertical section view typically illustrating the state of diffusion of excited electrons in the same structure.

FIG. 3 depicts a typical manner in which radiation or photon energy impinges on the radiation sensing device of the structure illustrated in FIGS. 1 and 2. As described above, since the thin-wall portion 14 through which the passage of excited electrons is attained by virtue of the tunnel effect is distributed substantially evenly in the tunnel barrier layer 13 when viewing it at the cross section along the same plane, and a maximum value of a plurality of distances which are the shortest linear distances from all arbitrary points on the superconductor 11 to the thin-wall part 14 falls within a fixed range, when the excited electrons 21 are produced by the absorption of radiation or photon energy 20 at any position of the first superconductive layer 16 of the superconductor 11, the time required by the excited electrons 21 in passing from the first superconductive layer 16 to the second superconductive layer 17 and eventually reaching the thin-wall portion 14 by virtue of diffusion is amply short and uniform.

The materials which are usable for the formation of the superconductor 11 and the superconductor 12 in the first embodiment of this invention specifically include aluminum, indium, tin, lead, tantalum, niobium, vanadium, $Nb_3Sn$, $Nb_3Ge$, $Nb_3Al$, $Nb_3Ga$, $NbN$, $Nb_3Al_{0.75}Ge_{0.25}$, $Nb_{0.55}Ti_{0.45}$, $V_3Ga$, $V_3Si$, and $Pb_1Mo_{5.1}S_6(SN)_x$ high polymer.

The materials which are usable for the formation of the tunnel barrier layer 13 (the thin-wall portion 14 and the thick-wall portion 15) include the oxides of the superconductive materials enumerated above such as, for example, alumina, indium oxide, tin oxide, lead oxide, tantalum oxide, niobium oxide, and silica. Of course, insulators other than the oxides of the superconductive materials are usable. Such semiconductors as Si, Ge, GaAs, and InSb are also usable.

The radiation sensing device of the first embodiment of this invention possessing the structure described above can be produced by thin-film forming techniques such as vacuum deposition, sputtering, or vapor-phase growth and by lithographic techniques using the materials enumerated above. For example, such production is effected by forming a thin film of a superconductive material as mentioned above by vacuum evaporation on a substrate, allowing the entire surface of the thin film to be spontaneously oxidized thereby forming an insulating layer which serves as a thin-wall portion of a tunnel barrier layer, then optionally forming a thin film of a superconductive material which serves as a partial layer of a counter electrode by vacuum evaporation, subsequently forming a resist film using a lithographic technique, oxidizing the portion not covered with the resist film by an anodic oxidation method thereby forming an insulating layer which serves as a thick-wall portion of the tunnel barrier layer (the insulating layer by the anodic oxidation extends amply below the insulating layer by the spontaneous oxidation and the thin film of superconductive material which serves as a lower electrode is not oxidized throughout the entire thickness of the layer) and giving rise to a tunnel barrier layer consisting of a thin-wall portion and a thick-wall portion of a desired pattern, removing the resist film, and thereafter forming a thin film of a superconductive material which serves as a partial layer of the counter electrode as by vacuum deposition. The method for the production of the radiation sensing device of this invention is not limited to the procedure just described. For the formation of the thin-wall portion and the thick-wall portion of the tunnel barrier layer, for example, a method which includes forming a layer of an insulating material or a semiconductive material on the entire surface or through partial masking using a thin-film forming technique such as, for example, vacuum evaporation may be adopted.

The description so far given has pertained to a superconducting tunnel junction radiation sensing device of the superconductor-tunnel barrier-superconductor structure. When one of the superconductors of the superconducting tunnel junction is a main absorbent for radiation or photon energy, the other superconductor is intended solely for the extraction of excited electrons and, therefore, the other superconductor may be replaced with a semiconductor having an energy gap similarly to a superconductor. Thus, the superconducting tunnel junction radiation sensing device according to the first embodiment of this invention embraces the superconductor-tunnel barrier-semiconductor structure.

Figure 11:
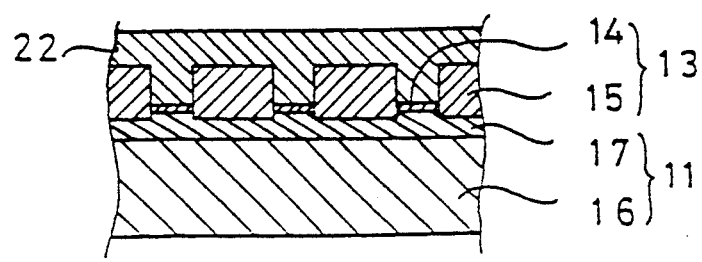
FIG. 11 is a fragmentary vertical section view illustrating yet another typical structure of the first radiation sensing device of this invention.

In yet another typical structure, the radiation sensing device according to the first embodiment of this invention possesses a superconductor-tunnel barrier-semiconductor structure which, as illustrated in FIG. 11, has a tunnel barrier layer 13 disposed throughout the entire junction between the superconductor 11 serving as a lower electrode and a semiconductor 22 serving as a counter electrode. The tunnel barrier layer 13, similar to the countertype in the aforementioned superconductor-tunnel barrier-superconductor structure, is composed of a thin-wall portion 14 made of a thin insulator or semiconductor and a thick-wall portion 15 made of a thick insulator or semiconductor. The relation between the thin-wall portion 14 and the thick-wall portion 15 with respect to thickness and disposition is similar to the above described superconductor-tunnel barrier-superconductor structure.

Also, in the device having the superconductor-tunnel barrier-semiconductor structure, from the standpoint of enhancing the collection efficiency of excited electrons in the thin-wall portion of the tunnel barrier layer due to the trap effect, the superconductor disposed on one side of the tunnel barrier layer may be composed of two or more superconductive layers having different energy gap magnitudes which are superposed in such a manner that the closer the superconductive layer is to the tunnel barrier layer, the smaller is the magnitude of the energy gap of the superconductive layer. In the typical structure illustrated in FIG. 11, for example, the superconductor 11 includes the first superconductive layer 16 located along the outer side and the second superconductive layer 17 having a smaller energy gap than the first superconductive layer 16 and located along the inner side, relative to the tunnel barrier layer 13. Incidentally, the semiconductor disposed on the other side of the tunnel barrier may be composed of two or more semiconductive layers of different energy gap magnitudes, in the same manner as described above.

In the radiation sensing device contemplated by the first embodiment of this invention and having the superconductor-tunnel barrier-semiconductor structure described above, the materials which are usable for the formation of the superconductor 11 and the tunnel barrier layer 13 (consisting of the thin-wall portion 14 and the thick-wall portion 15) are the same as those for the countertypes in the radiation sensing device of the superconductor-tunnel barrier-superconductor structure described above. The materials which are usable for the formation of the semiconductor 12 specifically include Si, Ge, GaAs, and InSb, for example. The method to be employed for the production of the radiation sensing device of this structure is the same as described above.

Figure 12:
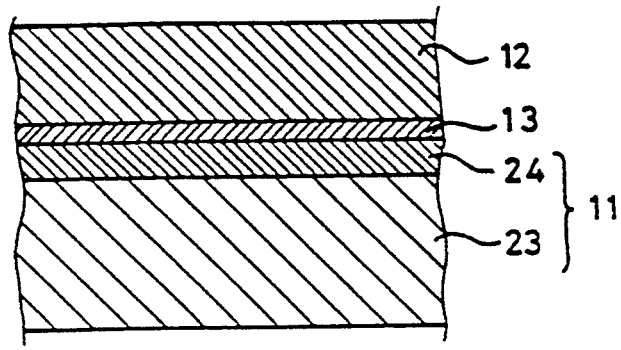
FIG. 12 is a fragmentary vertical section view illustrating a typical structure of the second radiation sensing device of this invention.

FIG. 12 is a fragmentary vertical section view illustrating a typical structure of the radiation sensing device according to the second embodiment of this invention.

The radiation sensing device illustrated in FIG. 12 possesses a superconductor-tunnel barrier-superconductor structure having a tunnel barrier layer 13 disposed throughout the entire junction between the lower superconductor 11 and the upper superconductor 12. The lower superconductor 11 is composed of a single-crystal superconductive layer 23 and a polycrystalline superconductive layer 24 superposed on the layer 23. The tunnel barrier layer 13, therefore, is formed on the polycrystalline superconductive layer 24.

In the radiation sensing device contemplated as the second embodiment of this invention and possessing the structure described above, the thickness of the polycrystalline superconductive layer 24 is required to be not less than 3 Å and not more than one half, preferably not more than one 10th, of that of the single-crystal superconductive layer 23. The reason for this particular upper thickness limit is that even when the thickness of the polycrystalline superconductive layer 24 increases past the level specified or the thickness of the single-crystal superconductive layer 23 decreases below the level, the collection efficiency of excited electrons as signal charges cannot be expected to increase. The reason for the lower thickness limit is that the polycrystalline superconductive layer 24 is not easily produced with substantial uniformity when the thickness of the polycrystalline layer is less than 3 Å.

Figure 13:
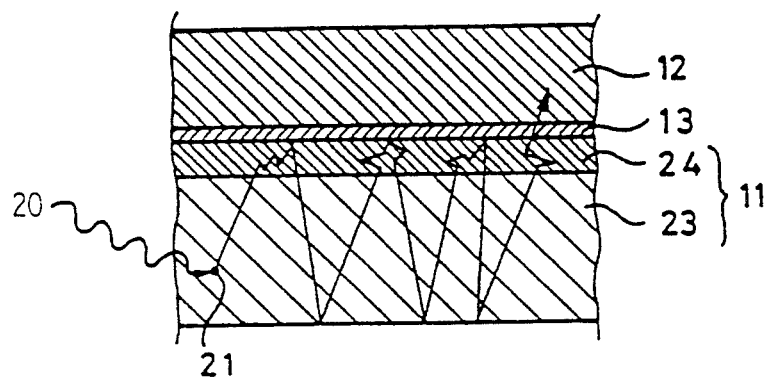
FIG. 13 is a fragmentary vertical section view typically illustrating the state of diffusion of excited electrons in the same structure.

FIG. 13 illustrates a typical manner in which the radiation or photon energy 20 impinges on the radiation sensing device of the structure illustrated in FIG. 12. It is believed that since the portion in which the excited electrons 21 are generated by the impingement of the radiation or photon energy 20 is formed of the single-crystal superconductive layer 23 as described above and the polycrystalline superconductive layer 24 deposited on the superconductive layer 23 has a small wall thickness, the average time required for completion of the tunneling of the excited electrons 21 is shortened and the probability that the excited electrons 21 will be output as signals is significantly improved.

Further, the radiation sensing device according to the second embodiment of this invention appreciably restrains the otherwise possible occurrence of leak current because the tunnel barrier layer 13 is not formed directly on the single-crystal superconductive layer 23, but is instead superposed on the polycrystalline superconductive layer 24 which has been formed on the single-crystal superconductive layer 23.

More specifically, the device having a tunnel junction formed by superposing the tunnel barrier layer 113 and the upper superconductive layer 112 directly on the single-crystal superconductor 131 as described above (FIG. 28) has a too large a leak current to be effectively applied to a radiation sensing device of high resolution. The present inventors conducted a diligent study with a view to elucidating the cause for this large leak current. We have consequently drawn the following conclusion.

When the tunnel barrier layer 113 of a very small thickness (generally not more than 10 nm) is formed as by vacuum evaporation on the polycrystalline superconductor 111 as illustrated in FIG. 29, the atoms or molecules which have reached the upper side of the superconductor 111 do not appreciably move around on the surface of the polycrystalline superconductor 111 but are instead immediately fixed thereon to give rise to a uniform film because numerous grain boundaries 130 are present in the polycrystalline superconductor 111. Of course, this phenomenon may partially depend on the combination of the substance of the superconductor 111 and the substance of the tunnel barrier layer 113. When the tunnel junction is formed by superposing the tunnel barrier layer on the polycrystalline superconductor as described above, the produced junction structure tends to acquire the desirable quality of exhibiting only a small leak current. It is considered that once the formation of the tunnel barrier layer 113 on the single-crystal superconductor 131 begins to take place, since the surface of the superconductor 131 is flat and smooth on the scale of the size of atoms, the atoms and molecules incident on the surface are liable to move around on the surface and grow in the form of islands, and that these islands eventually form a film as the amount of atoms and molecules adhering to the surface increases and the film assumes an uneven texture and abounds with pinholes. In this case, therefore, the formation of the junction tends to entail an increase in the leak current.

Figure 31A:
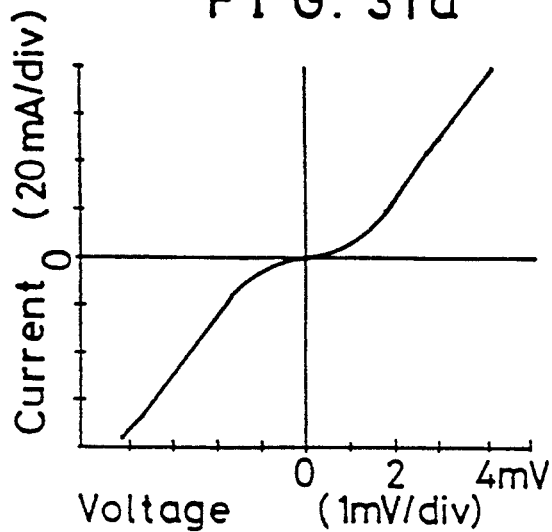
FIGS. 31a and 31b are graphs showing the current-voltage characteristic of the conventional superconducting tunnel junction using a single-crystal Nb film as a lower superconductor and having an Al-AlO$_x$ tunnel barrier layer and a polycrystalline Nb upper electrode directly superposed on the single-crystal Nb film in that order.
Figure 31B:
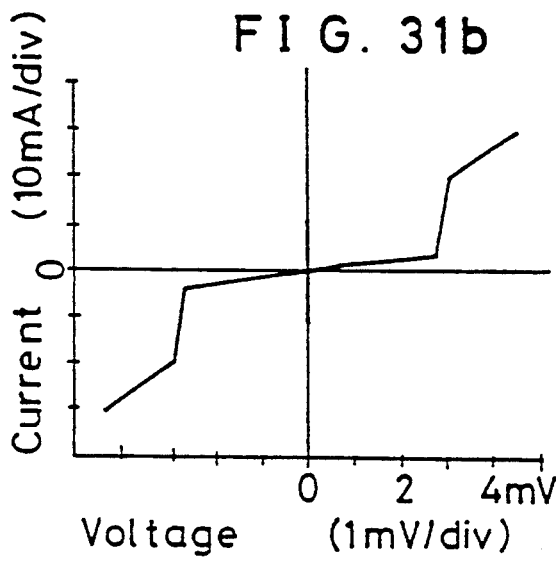
Figure 32:
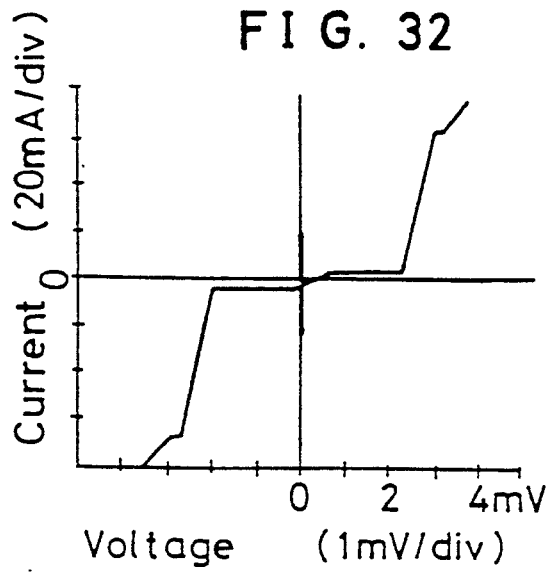
FIG. 32 is a graph showing the current-voltage characteristic of the device of the present invention depicted in one working example.
Figure 35:
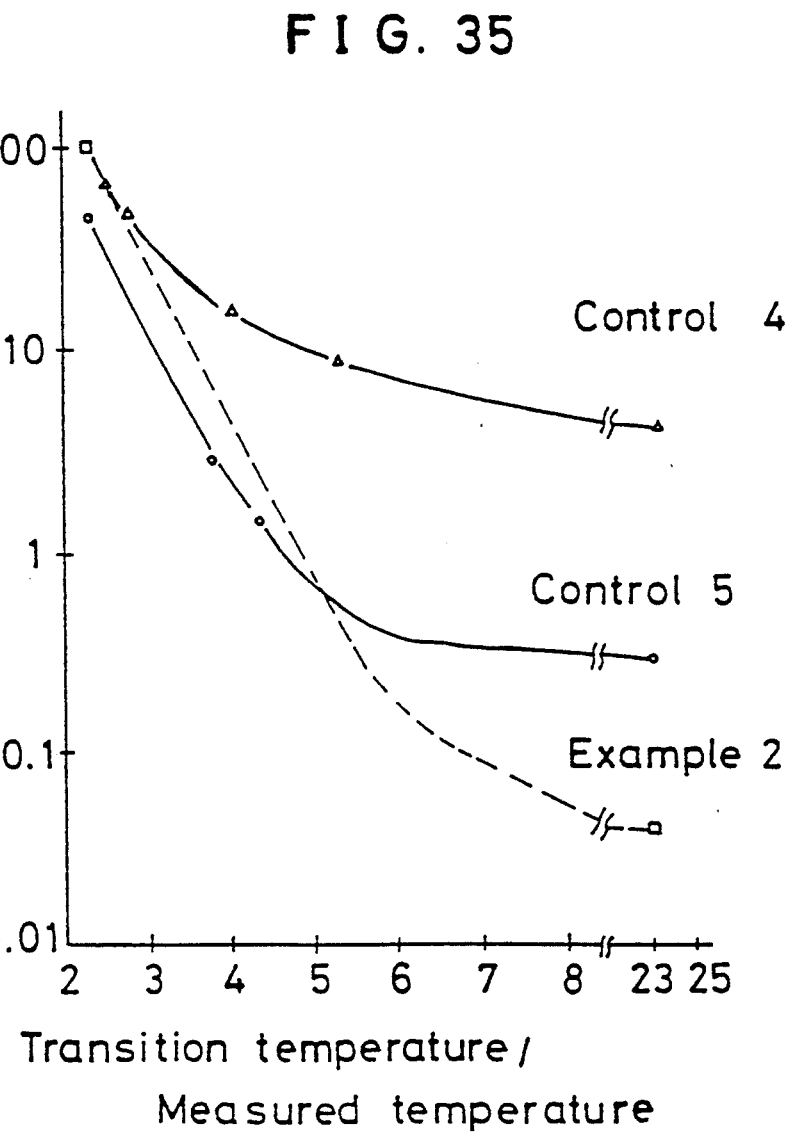
FIG. 35 is a graph showing the temperature dependency of the magnitudes of current at 1 mV of the conventional device and a typical example of the device of this invention.

With reference to the data obtained in an experiment which will be described specifically hereinafter, the reflection high-energy electron diffraction (RHEED) image (FIG. 33) of a film of Al vacuum evaporated in a thickness of about 10 nm on a single-crystal Nb film showed a single-crystal pattern of rough surface clearly different from an annular pattern appearing in the RHEED of a film of Al vacuum evaporated on the ordinary polycrystalline Nb film. This fact indicates that Al has grown into crystals in the form of islands or the underlying single crystals of Nb have not been completely covered by the grown crystals of Al. As a result, the leak current in the junction produced by superposing a Nb film on a layer of spontaneously oxidized Al is evidently inferior to that in the junction using the ordinary polycrystalline superconductor (FIGS. 31a and 31b). In contrast, in the device of the structure contemplated by the second embodiment of this invention which is produced by forming a thin polycrystalline Nb film on a single-crystal Nb film, vacuum evaporating Al thereon, then oxidizing the Al surface thereby giving rise to a tunnel barrier, and further superposing a Nb film thereon as an upper superconductor, the leak current is extremely small and favorably comparable with that of the conventional device using only polycrystalline superconductors (FIG. 32 and FIG. 35). The device used in this case is produced using superconductors made of Nb and a tunnel barrier layer made of Al having an oxidized surface. However, it is plain that the structure of the second embodiment of this invention can be extensively applied to various other combinations. When a tunnel barrier layer exhibiting bad lattice matching to a single-crystal superconductor is to be formed in a thickness of not more than 10 nm on the single-crystal superconductor, since the film generally tends to grow in the form of islands and creates an uneven texture, the tunnel barrier layer incorporated in a tunnel junction is liable to entail a large leak current. On the contrary, in the second embodiment of this invention, since a polycrystalline superconductor film is formed onto the single-crystal superconductor, the tunnel barrier layer which is superposed on the polycrystalline superconductor film can be formed uniformly even in such a small thickness, without regard to the bad lattice matching. Thus, in the second embodiment, many combinations of substances for the single-crystal superconductor, the polycrystalline superconductor and the tunnel barrier layer can be utilized. The substance which composes the polycrystalline superconductor film is not limited as far as it tends to grow a film uniformly on the single-crystal superconductor (it can be polycrystal of the same chemical composition as the single-crystal superconductor). However, the tunnel barrier layer should be an insulator or semiconductor formed by superposing on the polycrystalline superconductive layer, but not by reforming the surface of the preformed polycrystalline superconductor, such as oxidization of surface. This is because in the case where a part which is in a layer superposed on a single-crystal superconductor for constructing the tunnel barrier and which is located at a site far from the surface of the layer remains in an original state without reforming after the reforming treatment of the layer (for example, in the case where Al is directly superposed on single-crystal Nb thickly and only a surface portion of the Al layer is oxidized), the part should be considered to be a part of the tunnel barrier, as considered in general. Even though the non-reforming substance can function as a superconductor in a certain condition (for example, Al can behave as a superconductor under a temperature below about 1.3K.), the part should not be considered to be the polycrystalline superconductor layer that is defined in this invention.

In the radiation sensing device according to the second embodiment of this invention, the structure of the upper superconductor 12 is not critical. While it suffices to form the upper superconductor 12 with a superconductor, it is naturally permissible to produce this upper superconductor 12 in a structure such that, similar to the lower superconductor 11, the polycrystalline superconductive layer of a small thickness is disposed on the side exposed to the tunnel barrier layer 13 and the single-crystal superconductive layer is superposed thereon.

Figure 14:
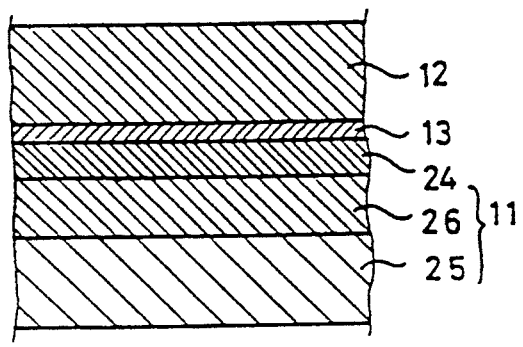
FIGS. 14 and 15 are fragmentary vertical section view illustrating other typical structures of the second radiation sensing device of this invention.
Figure 15:
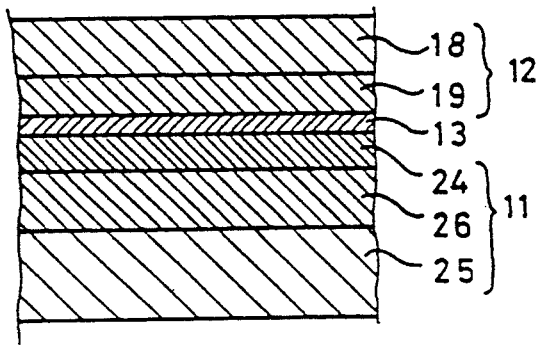

FIG. 14 and FIG. 15 represent other typical structures of the radiation sensing device according to the second embodiment of this invention. In each of these structures, for the purpose of enhancing the trapping effect of excited electrons, the lower superconductor 11 is composed as shown of a first single-crystal superconductive layer 25, a second single-crystal superconductive layer 26 having a smaller energy gap than the first single-crystal superconductor 25, and a polycrystalline superconductive layer 24, and the upper superconductor 12 is composed as shown (in FIG. 15) of a first superconductive layer 18 located along the outer side and a second superconductive layer 19 having a smaller energy gap located along the inner side, relative to the tunnel barrier layer 13.

The radiation sensing device of the second embodiment of this invention, similarly to the radiation sensing device of the first embodiment described above, embraces the superconductor-tunnel barrier-semiconductor structure (not shown).

The radiation sensing device of the second embodiment of this invention can be produced by employing a thin film forming technique, such as the vacuum evaporation, the sputtering, or the vapor phase growth, using the same material as specifically mentioned in the foregoing description of the first embodiment. This production, for example, may be accomplished by forming on a substrate a single-crystal superconductor of the aforementioned description by vacuum evaporation, then superposing thereon a thin film of polycrystalline superconductor by vacuum evaporation or sputtering, subsequently depositing on the polycrystalline superconductor thin film a substance for forming a tunnel barrier layer by vacuum evaporation or sputtering, allowing the entire surface of the deposited layer to undergo spontaneous oxidation giving rise to an insulating layer, and thereafter forming an upper superconductive layer by vacuum evaporation. The method for the production of the radiation sensing device of the second embodiment of this invention is not limited to the procedure described above.

Figure 16:
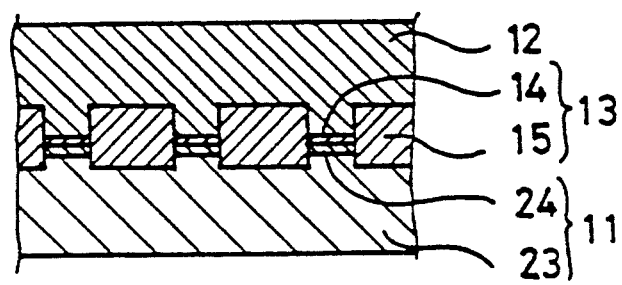
FIG. 16 is a fragmentary vertical section view illustrating a typical structure of the third radiation sensing device of the present invention.

FIG. 16 is a fragmentary vertical section view illustrating a typical structure of the radiation sensing device according to the third embodiment of this invention.

The radiation sensing device illustrated in FIG. 16 possesses a superconductor-tunnel barrier-superconductor structure having a tunnel barrier layer 13 disposed in junction between a superconductor 11 forming a lower electrode and a superconductor 12 forming a counter electrode. This tunnel barrier layer 13 is composed of thin-wall portions 14 made of a thin insulator or semiconductor and a thick-wall portion 15 made of a thick insulator or semiconductor. The thin-wall portions 14 and the thick-wall portion 15 each have opposite first and second surfaces respectively contacting the lower and counter electrodes 11, 12 and each extend adjacent each other in a same horizontal plane between the lower and counter electrodes 11, 12. The lower superconductor 11 is composed of a single-crystal superconductive layer 23 and a polycrystalline superconductive layer 24 superposed thereon. The tunnel barrier layer 13 (at least the thin-wall portion 14 thereof) is formed on the polycrystalline superconductive layer 24.

In the radiation sensing device of the third embodiment of this invention, the relation between the thin-wall portion 14 and the thick-wall portion 15 of the tunnel barrier layer 13 in terms of vertical thickness and disposition is the same as that described above with respect to the radiation sensing device of the first embodiment of this invention. In the radiation sensing device of this third embodiment, the relation between the single-crystal superconductive layer 23 and the polycrystalline superconductive layer 24 of the lower superconductor 11 in terms of thickness and the like is the same as that described above with respect to the radiation sensing device of the second embodiment of this invention.

Further, in the radiation sensing device of the third embodiment, the portion in which the polycrystalline superconductive layer 24 of the lower superconductor 12 is formed is required to where the superconductive layer 24 adjoins at least the thin-wall portion 14 of the tunnel barrier layer 13 as described above. The reason for this condition is that any structural defect of the film which is liable to cause leak current does not readily occur in the amply thick thick-wall portion 15 even when the tunnel barrier layer 13 is made of a substance exhibiting bad lattice matching to the single-crystal superconductive layer 24.

Figure 17:
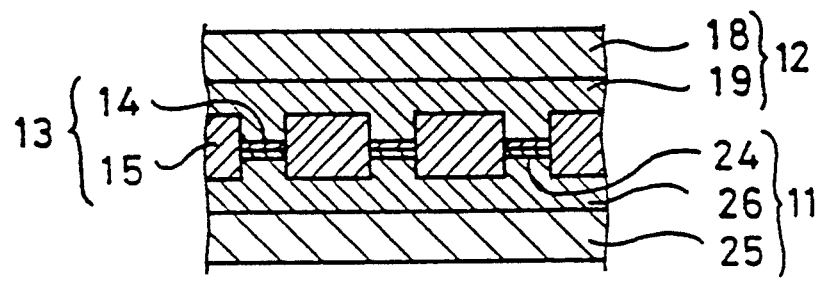
FIGS. 17 and 18 are fragmentary vertical section views illustrating yet other typical structures of the third radiation sensing device of this invention.
Figure 18:
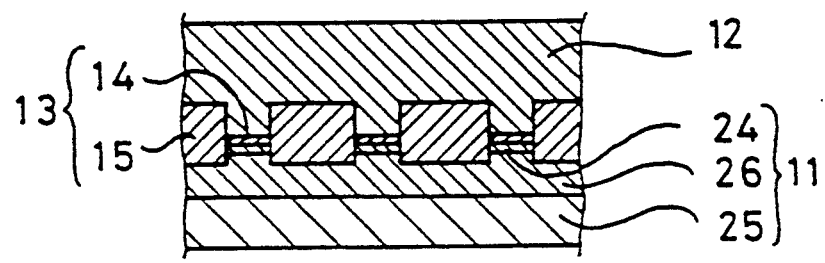

FIG. 17 and FIG. 18 represent other typical structures of the radiation sensing device of the third embodiment. In each of the structures, for the purpose of enhancing the trapping effect of excited electrons, the lower superconductor 11 is composed as shown of a first single-crystal superconductive layer 25, a second single-crystal superconductive layer 26 having a smaller energy gap than the first single-crystal superconductive layer 25, and a polycrystalline superconductive layer 24 and the upper superconductor 12 is composed of a first superconductive layer 18 located along the outer side and a second superconductive layer 19 having a smaller energy gap and located along the inner side relative to the tunnel barrier layer 13.

The radiation sensing device of the third embodiment of this invention, similar to the radiation sensing device of the first embodiment described above, embraces a radiation sensing device having a superconductor-tunnel barrier-semiconductor structure (not shown).

The radiation sensing device of the third embodiment of this invention possessing this structure manifests truly prominent characteristics due to the synergism between the structural advantages aspects of the first and second embodiments mentioned above. Since the portion in which excited electrons are produced by the impingement of radiation or photon energy is formed of the single-crystal superconductive layer and the polycrystalline superconductive layer superposed thereon is thin, the excited electrons have a long mean free path in the single-crystal superconductor. Because of this fact, the average time required in completing the tunneling is shortened. Further, since the thin-wall portion is substantially evenly distributed in the tunnel barrier layer when viewing it at the cross section along the same horizontal plane, and a maximum value of a plurality of distances which are the shortest linear distances from all arbitrary points on the lower superconductor to the thin-wall portion falls within a fixed range, the time required by the excited electrons in reaching the thin-wall portion by virtue of diffusion is amply short and uniform, regardless of where the electrons are excited in the single-crystal superconductive layer of the lower electrode. Consequently, the probability with which the excited electrons are output as signals is enhanced in a large measure and the variations in rise time and pulse magnitude of signals due to the position of impingement are restrained to small values. Moreover, at least the thin-wall portion of the tunnel barrier layer possesses a uniform layer structure and generates leak current only sparingly because it is not formed on the single-crystal superconductive layer, but instead on the thin-wall polycrystalline superconductive layer superposed on the single-crystal superconductive layer.

The radiation sensing device of the third embodiment of this invention possessing this structure can be produced by employing a thin-film forming technique, such as vacuum evaporation, sputtering, or vapor-phase growth, and a lithographic technique, using the same material as specifically cited in the foregoing description with respect to the radiation sensing device of the first embodiment. This production is effected, for example, by forming on a substrate a single-crystal superconductive layer by vacuum evaporation, then superposing on the single-crystal superconductive layer a thin film of polycrystalline superconductor by vacuum evaporation or sputtering, depositing thereon a material capable of forming a thin-wall portion of the tunnel barrier layer likewise by vacuum evaporation or sputtering, allowing the deposited layer of the material to undergo spontaneous oxidation to, giving rise to an insulating layer which serves as a thin-wall portion of the tunnel barrier layer, optionally forming a layer of a superconductive material destined to form a partial layer of a counter electrode as by vacuum evaporation, forming a resist film by a lithographic technique, allowing the portion not covered with the resist film to be oxidized by the anodic oxidation method, thereby forming an insulating layer which serves as a thick-wall portion of the tunnel barrier layer (the insulating layer by this anodic oxidation extends amply below the insulating layer by the spontaneous oxidation mentioned above and the superconductive material forming the lower electrode is not oxidized throughout the entire thickness of the layer) and consequently giving rise to a tunnel barrier layer consisting of a thin-wall portion and a thick-wall portion and possessing a desired pattern, removing the resist film, and further forming a thin film of a superconductive material to serve as a partial layer of the counter electrode by vacuum evaporation. The method for the production of the radiation sensing device of the third embodiment of this invention is not limited to the procedure described above.

The junction structure in the Josephson device according to the fourth embodiment of this invention is substantially identical to that in the radiation sensing device of the second embodiment of this invention.

Specifically, the Josephson device according to the fourth embodiment of this invention possesses a superconductor-tunnel barrier-superconductor structure having a tunnel barrier layer 13 disposed throughout the entire junction between a lower superconductor 11 and an upper superconductor 12 as illustrated in FIG. 12. In this structure, the lower superconductor 12 is composed of a single-crystal superconductive layer 23 and a polycrystalline superconductive layer 24 and, therefore, the tunnel barrier layer 13 is formed on the polycrystalline superconductive layer 24.

In the Josephson device of the fourth embodiment of this invention possessing this structure, the single-crystal superconductive layer 23 is required to have a thickness exceeding the magnetic penetration length in order that it may act as a magnetic shield.

In the Josephson device of the fourth embodiment of this invention, since the possibility of the device generating leak current is curbed in a great measure for the same reason as given above in the foregoing description of the radiation sensing device of the second embodiment, the Josephson device to be produced imposes a marked restraint on the occurrence of a magnetic flux trap by virtue of the single-crystal superconductor and manifests high characteristics.

EXAMPLES

For a more specific illustration of the present invention, the following examples are presented which are intended to be merely illustrative of and not in any sense limitative of the invention.

Experiment 1: Discussion on device's response speed

Figure 19A:
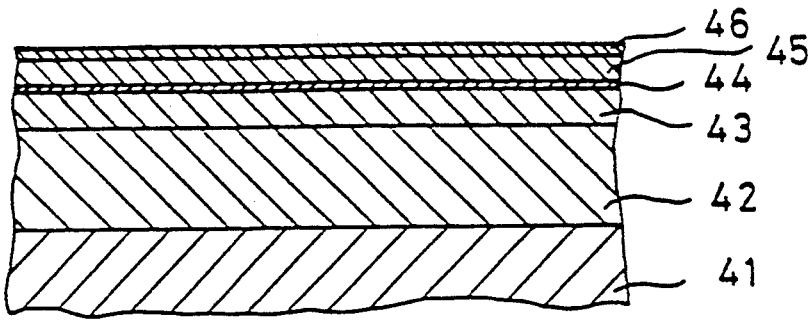
FIGS. 19a to 19d are fragmentary vertical section views illustrating the process flow in the production of the first radiation sensing device of this invention as depicted in a working example.

Referring to FIG. 19(a), to produce a device contemplated by the first embodiment of this invention (Example), a Nb film 42 having a thickness of 5,000 Å was deposited as a first superconductive layer of a lower superconductor on a glass substrate 41, an Al film 43 having a thickness of 500 Å was further superposed thereon as a trapping superconductive layer by sputtering, then the surface of the Al film 43 was spontaneously oxidized at room temperature in a vacuum under introduction of oxygen gas thereby giving rise to an AlO$_x$ film 44 having a thickness of 20 to 30 Å and destined to serve as a tunnel barrier (thin-wall layer), and further continuously superposing thereon an Al film 45 having a thickness of 500 Å and destined to serve as a trapping superconductive layer and a Nb film 46 having a thickness of 200 Å by sputtering.

Figure 19B:
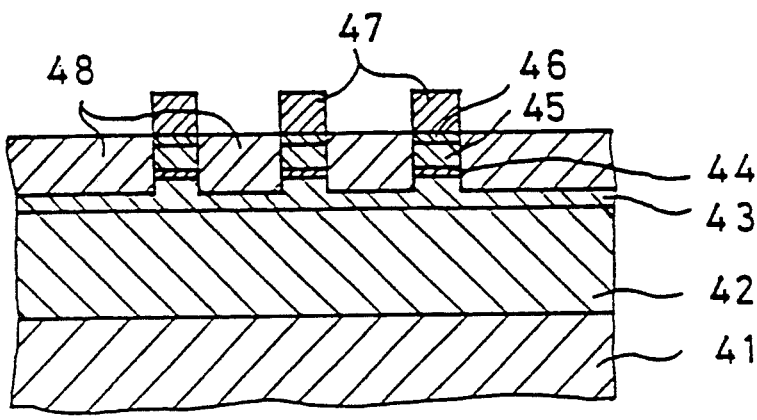

Then, an anodically oxidized layer 48 destined to form a thick-wall portion of a tunnel barrier layer was produced as illustrated in FIG. 19(b) by forming a resist film 47 using a lithographic technique so as to cover only the portions in which the thin-wall portions of the tunnel barrier layer was desired to be formed and subjecting the portion not covered with the resist film 47 to anodic oxidation. The anodically oxidized film 48 was produced, with due care taken so that the film would grow amply below the AlO$_x$ film 48 and the Al film 43 would not be wholly oxidized.

Figure 19C:
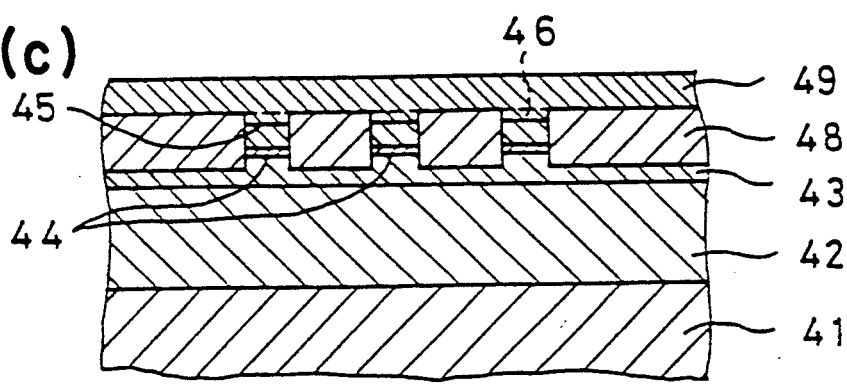

Subsequently, the resist film was removed, the surface was cleaned by Ar sputtering in a vacuum, and a Nb film 49 having a thickness of 1000 Å was formed by vacuum evaporation on the upper surface of the laminated structure as illustrated in FIG. 19c.

Figure 19D:
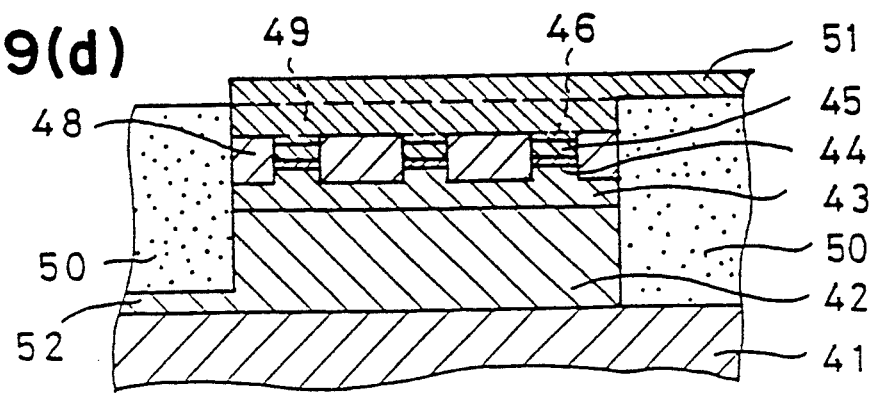

Finally, the resultant laminate composite was fabricated by lithography and reactive ion etching into a device structure as illustrated in FIG. 19d and a Nb film 51 for upper wiring was deposited thereon by vacuum evaporation.

Figure 20:
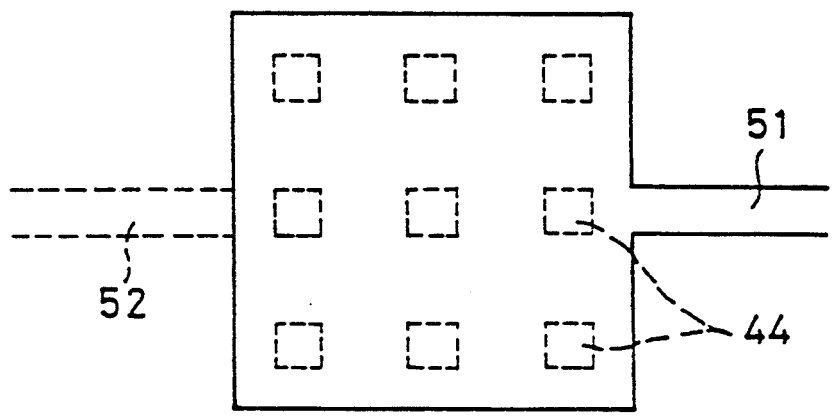
FIG. 20 is a plan view of the device produced in the working example.

FIG. 20 is a plan view illustrating the device thus produced. In this device, the part of the AlO$_x$ film 44 remaining as the thin-wall portions consisted of nine component portions distributed evenly in the device. These component portions each had a cross-sectional area of 0.0009 mm$^2$ at a cross section parallel to the surface of the device between the lower superconductor and the upper superconductor. The total cross-sectional area of the device (excluding the upper wiring 51 and the lower wiring 52) at the cross section was 0.0729 mm$^2$.

The thickness of the anodically oxidized film 48 portion was about 1,000 Å and the thickness of the AlO$_x$ film 44 portions were 20 to 30 Å. Since the electric capacitance of a film of this kind per unit area is inversely proportional to the thickness of film, the electric capacitance of the device was substantially determined exclusively by the AlO$_x$ film 44 portions destined to serve as thin-wall portions and possessing a total cross-sectional area of 0.0081 mm$^2$, though the cross-sectional area 0.0648 mm$^2$ of the anodically oxidized film 48 portion accounted for 89% of the total cross-sectional area of the sensing device at the cross section parallel to the surface of the device.

In the case of a device having a total cross-sectional area of 0.0729 mm$^2$ (square of 0.27 mm) at a cross section parallel to the surface of the device and containing an AlO$_x$ film portion destined to serve as a thin-wall portion and possessing a total cross-sectional area of 0.0081 mm$^2$ at the cross-section and constituting itself one inseparate square portion located at the center of the device (hereinafter referred to as "device of Control 1"), the electrons or holes excited in the corners of the device must be diffused over a linear distance of at least 126 μm in reaching the thin-wall portion of the tunnel barrier layer. In contrast, in the device of Example 1, even the electrons or holes excited in the corners of the device must be diffused over a linear distance of 42 μm.

Since the length of diffusion barely increases in proportion to the 0.5th power of the time, this three-times difference in diffusion length brings about an extremely large difference concerning the response speed of the device and the rise time and the magnitude of the signal due to the position of incidence of radiation or photon energy.

Actually, to obtain this difference, the device of Example 1 and the device of Control 1 mentioned above were uniformly exposed at their entire surfaces to a pulse laser beam (pulse width 200 ns) and the responses of these devices were compared. It was consequently found that the rise time of the detection signal was 400 ns in the device of Example 1 as compared with 600 ns in the device of Control 1. The fact that the ratio of rise time of the signal between the two devices was about 1.5:1 may be logically explained by a supposition that the pulse width itself of the pulse laser beam used for the exposure was as large as 200 ns and the signals were produced by the average diffusion of the electrons or holes excited in the corners of device and the electrons or holes excited in the central part of device because the entire surfaces of the devices were uniformly exposed to the pulse beam. It is surmised that this ratio of rise time exclusively of the signals due to the electrons or holes excited in the corners of device would be much larger.

The peak magnitude of the signals in the device of Example 1 detected in the experiment, reflecting the condition that the proportion of excited electrons and holes recombine during the course of the rise of the signal increases in proportion to the rise time is lengthened, was about 1.3 times that in the device of Control 1. Concerning the magnitude of signals, it is naturally expected that the ratio of the size exclusively of the signals due to the electrons or holes excited in the corners of device would be much larger.

By the present experiment, it has been demonstrated that the radiation sensing device possessing the structure of this invention possesses outstanding characteristics. It has been further established that even when the total cross-sectional area, at the cross section parallel to the surface of the device, of the thin-wall portions serving as a substantial tunnel barrier is fixed, more desirable results are obtained by decreasing the cross-sectional area of each of the thin-wall portions, increasing the number of such thin-wall portions, and having the thin-wall pieces evenly distributed in the device.

EXPERIMENT 2: DISCUSSION ON LEAK CURRENT IN DEVICE (1)

An device contemplated by the second embodiment of this invention (Example 2) was produced as follows.

Figure 34:
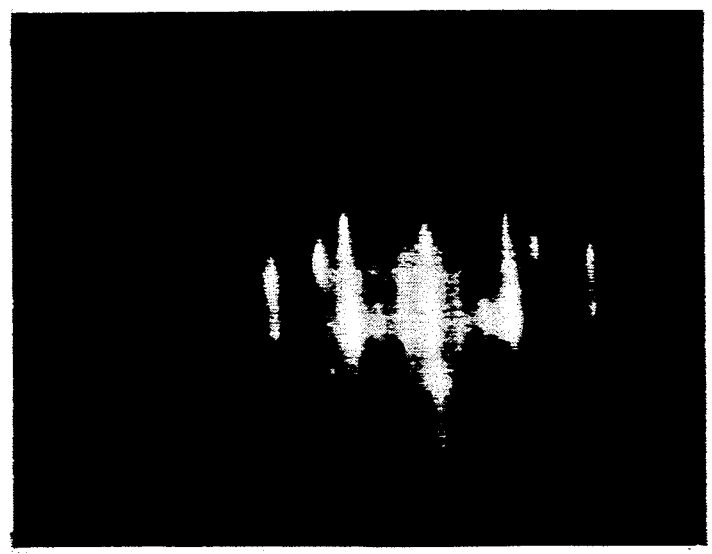
FIG. 34 is a photograph showing the RHEED pattern image of a single-crystal Nb film.

A single-crystal sapphire of a (1̄102) plane was used as a substrate 61. This substrate 61 was placed in an ultrahigh vacuum evaporation device having an obtainable vacuum degree of about $1 \times 10^{-10}$ Torr and heated to about 700° C. with a heater disposed behind the substrate 61. An ingot of Nb was placed in a water-cooled copper crucible and heated by exposing the surface thereof to an electron beam to effect vacuum evaporation of Nb. The Nb film 62 consequently deposited on the sapphire substrate 61 grew into a single-crystal film as evinced by a reflection high-energy electron diffraction (RHEED) image shown in FIG. 34. This film had a thickness of about 600 nm.

Then, the resultant composite was taken out of the vacuum evaporation device and set in place in a sputtering device provided with Nb and Al sputtering targets.

Figure 21:
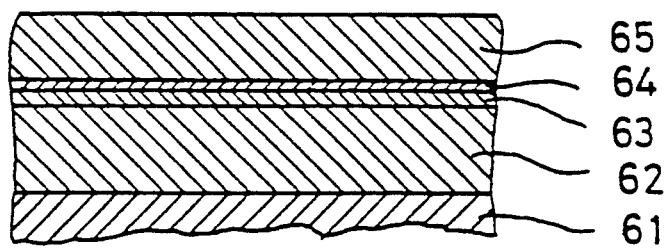
FIGS. 21 and 22 are fragmentary vertical section views illustrating the process flow in the production of the second radiation sensing device of this invention as depicted in a working example.

Inside the sputtering device, the composite (substrate) was kept cooled with water near room temperature (about 20° C.±10° C.). In the sputtering device, the surface of the Nb film 62 was etched in a depth of about 3 nm by reverse sputtering with Ar so as to give a clean surface to the Nb film 62. Then, on the composite, a Nb film 63 about 20 nm in thickness and an Al film about 10 nm were superposed by sputtering. Subsequently, in the sputtering device, the surface of the Al film was spontaneously oxidized with an oxygen gas of about 1 Torr introduced into the device to give rise to an AlO$_x$-Al film 64. Further thereon, a polycrystalline Nb film 65 of about 200 nm in thickness was superposed as an upper superconductor by sputtering. This condition of stratification is depicted in FIG. 21.

Figure 22:
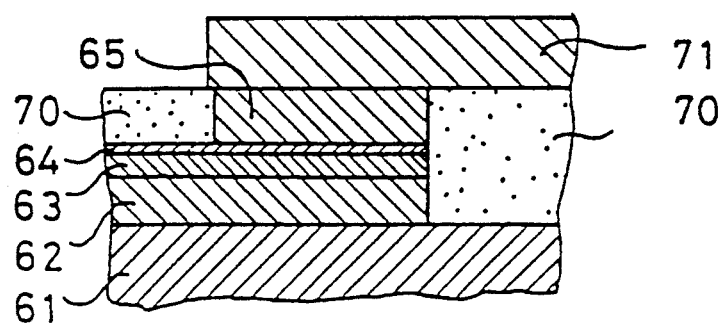
Figure 23:
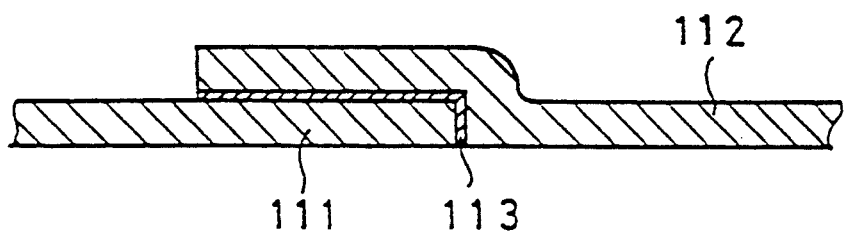
FIG. 23 is a vertical section view illustrating a typical structure of the conventional radiation sensing device.
Figure 24:
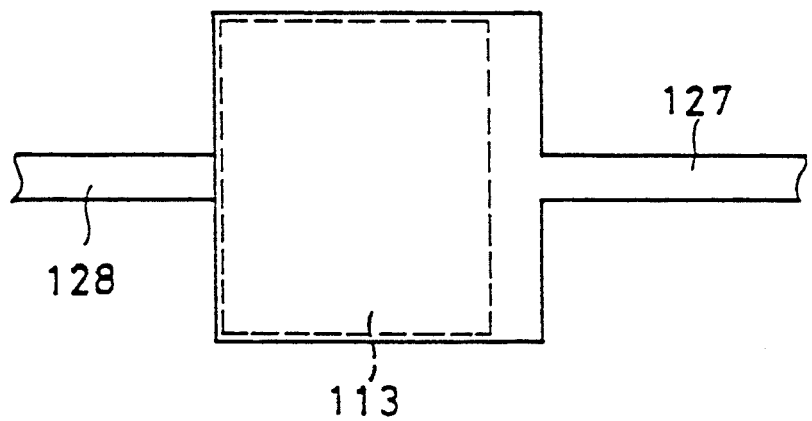
FIG. 24 is a plan view of the conventional device.
Figure 25:
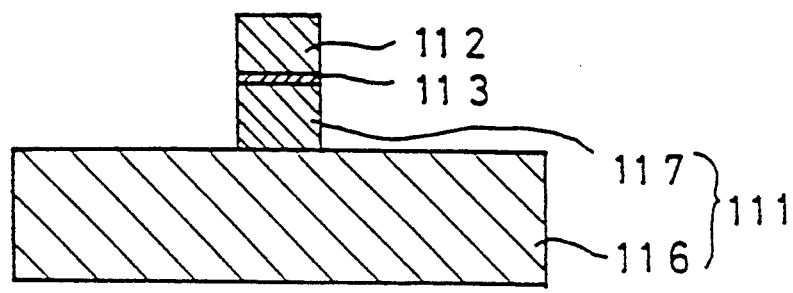
FIG. 25 is a vertical section view illustrating another typical structure of the conventional radiation sensing device.
Figure 26:
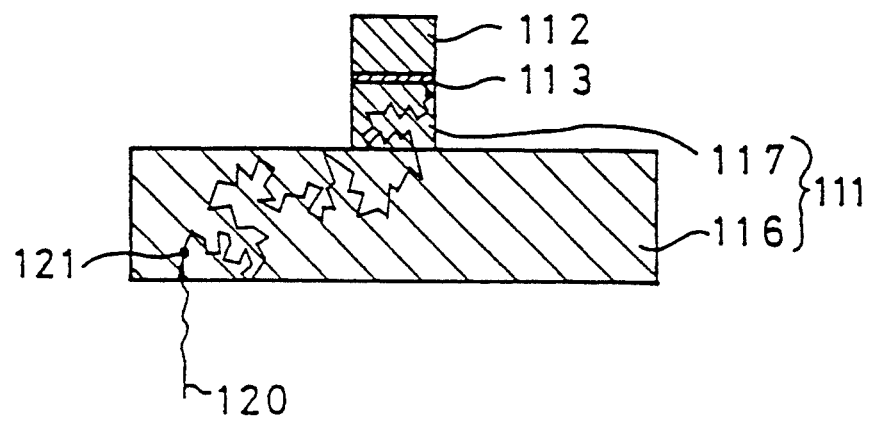
FIG. 26 is a vertical section view typically illustrating the state of diffusion of excited electrons in the conventional device shown in FIG. 25.

A device configured as illustrated in FIG. 22 was produced by subjecting the product resulting from the aforementioned superposition effected on the entire surface of the Sapphire substrate to fine processing by the SNIP (Self-aligned Niobium Isolation Process) technique. The Nb film for the upper wiring 71 was also superposed by sputtering. The lower wiring was formed by processing a single-crystal Nb film. The width of wire was 20 μm. The junction area was 80 μm×80 μm. In FIG. 22, reference numeral 70 denotes a SiO$_2$ film intended as an interlayer insulating layer.

For comparison, two devices (Controls 2 and 3) were produced as follows.

In the production of the device of Control 2, a single-crystal Nb film was formed first in the same manner as in Example 2 and an Al film about 10 nm in thickness was directly superposed thereon by sputtering following reverse sputter cleaning with Ar, without forming a polycrystalline Nb film thereon in the meantime. Then, after the pattern of Example 2, the resultant composite was placed in a sputtering device, the surface of the Al film was spontaneously oxidized by introducing an oxygen gas of about 1 Torr in the device, and a Nb film of about 200 nm in thickness was deposited thereon as an upper superconductor by sputtering. The resultant product of superposition was subjected to fine processing by the SNIP method to produce the device.

Figure 33:
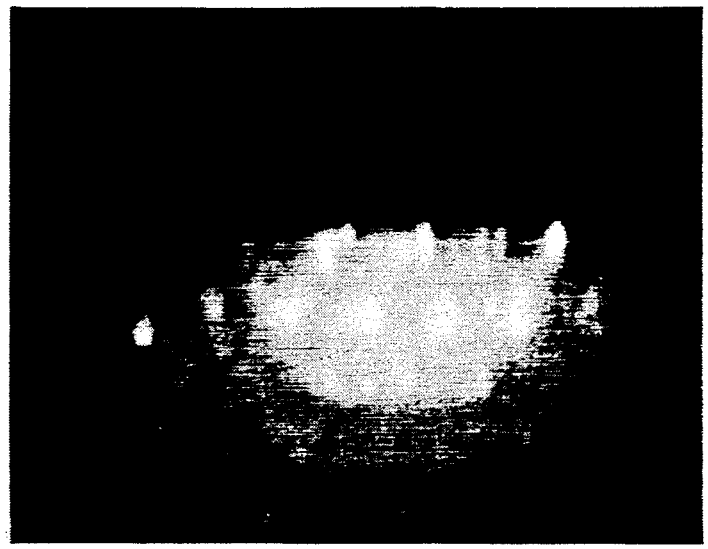
FIG. 33 is a photograph showing the RHEED pattern image of an Al film formed on a single-crystal Nb film.

In the production of the device of Control 3, a single-crystal Nb film was formed in the same manner as in Example 2 and an Al film of about 10 nm in thickness was directly superposed thereon by vacuum evaporation in the same vacuum evaporation apparatus without forming a polycrystalline Nb film thereon in the meantime. A RHEED of the composite obtained by vacuum evaporating an Al film on this single-crystal Nb film is shown in FIG. 33. Subsequently, the surface of the Al film was spontaneously oxidized and a Nb film of about 200 nm in thickness was superposed thereon as an upper superconductor by vacuum evaporation. The resultant composite was finely processed by the SNIP method to produce the device.

The devices of Example 2 and Controls 2 and 3 obtained as described above were tested for current-voltage characteristics at 4.2K. The results are shown in FIG. 32 and FIGS. 31a and b.

It is clearly noted from FIGS. 31a and b that in the devices of Controls 2 and 3 having a tunnel barrier layer superposed directly on a single-crystal superconductor, the current at a voltage of not more than about 2 mV was so large as to entail a large leak current. These characteristics are evidently inferior to those of the devices using an ordinary polycrystalline superconductor. In contrast, in the device of example 2, the leak current discernible at 4.2K was equivalent to or lower than that of the device using only the conventional polycrystalline Nb.

EXPERIMENT 3: DISCUSSION ON LEAK CURRENT IN DEVICE (2)

For a more deliberate study of the leak current, it is a worthwhile effort to lower the temperature of the sample. This is because the electric current which flows due to the tunnel effect of the thermally excited electrons is decreased by lowering the temperature, whereas the leak current does not depend on temperature.

Actually, the device of Example 2 described above was tested for temperature dependence of the magnitude of electric current at 1 mV. The results are shown in FIG. 35.

As conventional devices to be used for comparison, a device (Control 4) in a polycrystalline Nb film-AlO$_x$ film-polycrystalline Nb film structure was produced by the SNIP method and a device (Control 5) of a polycrystalline Nb film-AlO$_x$ film-polycrystalline Nb film structure was produced by the SNEP (selective niobium etching process) technique. These devices were similarly tested for temperature dependence of the magnitude of electric current at 1 mV. The results are shown in FIG. 35. In the devices of Control 4 and Control 5, the Nb films had a thickness of about 200 nm and the AlO$_x$ films had a thickness of about 2–3 nm.

It was found consequently that the leak current in the device of Example 2 conforming to this invention was considerably smaller than that of the device of Control 4 as shown in FIG. 35 and was equal to or smaller than that of the device of Control 5 produced by the SNEP method resorting to the anodic oxidation capable of decreasing the leak current at the end of junction. These results may be logically explained by a supposition that in the device of Example 2, since the surface of the single-crystal Nb film was covered with a thin polycrystalline Nb film, the Al film formed thereon did not grow in the form of islands and that the single-crystal Nb film epitaxially grown on the Sapphire substrate possessed so a high mechanical strength as to preclude the ready occurrence of defects on the inner surface of the tunnel barrier or in the end parts of the tunnel barrier during the course of fine molding.

Incidentally, in the devices of Controls 2 and 3 described above having a tunnel barrier layer directly superposed on a single-crystal superconductor (not shown), the magnitudes of current were lowered only sparingly when the temperature was lowered in the manner described above. This fact supports the results of Experiment 2.

EXPERIMENT 4: DISCUSSION ON RADIATION SENSING CAPACITY

For a direct study of the influence of this invention on the performance of a radiation sensing device, the device of Example 2 which had undergone the treatment of the SNIP method, the device of Control 4 which had similarly undergone the treatment of the SNIP method, and the device of Control 5 which had undergone the treatment of the SNEP method, were severally exposed to X-ray energy of about 5.9 keV and the signals consequently issued from the devices were dispersed into pulse-height spectra. During the experiment, the devices were invariably cooled to 0.4K.

In the device of Control 4, i.e. a conventional device which had undergone the treatment of the SNIP method, no discernible signal was found even when the surface area of device was decreased to 20 μm×20 μm for the purpose of decreasing the leak current. The signal resulting from the X-ray energy, if generated, was smaller than the noise and, therefore, could not be discriminated from the noise.

Figure 36:
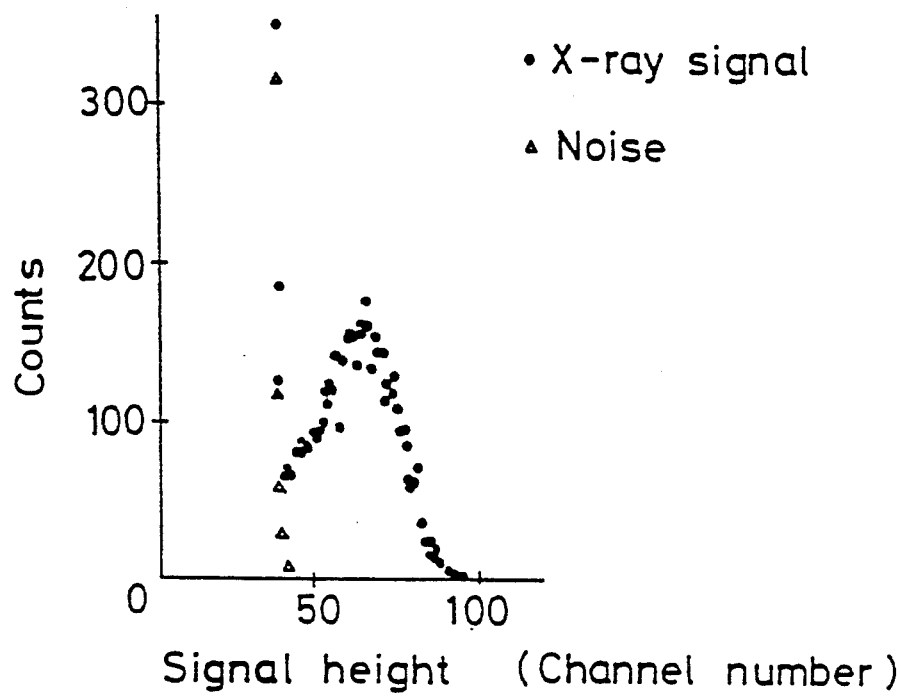
FIG. 36 is a graph showing the 5.9 keV X-ray measuring pulse height spectrum with the conventional device fabricated by the SNEP method.

In the device of Control 5, i.e. a conventional device which had undergone the treatment of the SNEP method, when the surface area of device was 20 μm×20 μm, the signal resulting from the X-ray energy could be discriminated from the noise. This improvement in signal may be logically explained by a postulate that the leak current in this device was smaller than that in the conventional device which had undergone the treatment of the SNIP method as shown in FIG. 35. The pulse-height spectrum is shown in FIG. 36. The magnitude of the electric charge of the signal in response to the X-ray energy, namely the magnitude of the signal corresponding to the peak of the pulse-height spectrum, was about 10 times as large as that of the conventional semiconductor radiation sensing device using Si or Ge. The electric charge thus output in the form of signals was still as small as about one one-hundredth of the theoretically estimated magnitude of excited electrons generated in Nb by the X-ray energy, indicating that the excited electrons were not efficiently output as signal charges.

Figure 37:
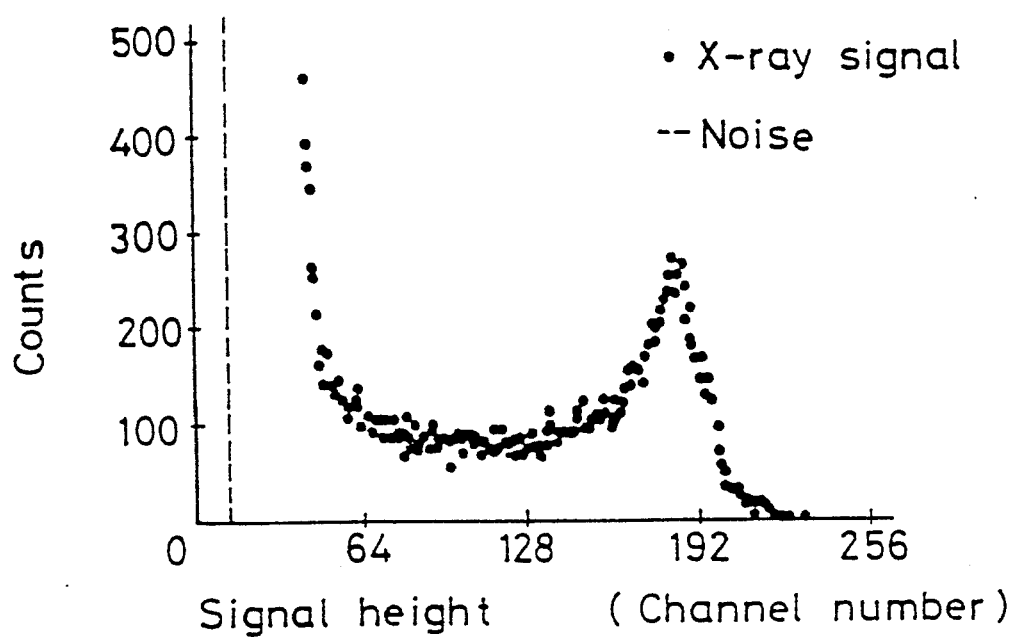
FIG. 37 is a graph showing the 5.9 keV X-ray measuring pulse height spectrum with the device embodying the present invention and fabricated by the SNIP method.

In contrast, in the device of Example 2 conforming to the present invention, a pulse-height spectrum shown in FIG. 37 was obtained when the surface area of device was 80 μm×80 μm. Since the amplification ratios of the signal amplifiers used were different, like channel numbers do not correspond to like signal sizes between the horizontal axis of FIG. 36 and the horizontal axis of FIG. 37. In both of the spectra, the peak values along the horizontal axes equaled 5.9 keV. FIG. 37 shows evidently better S/N ratios (ratio of signal size/noise size) than FIG. 36. In the case of the spectrum of FIG. 37, the magnitude of electric charge of signal by the X-ray was 150 to 180 times that of the conventional semiconductor radiation sensing device using Si or Ge and about 20 times that of the conventional device which had undergone the treatment of the SNEP method.

We claim:

1. In a superconducting tunnel junction radiation sensing device having first and second superconductor electrodes and a tunnel barrier layer interposed between said first and second superconductor electrodes, wherein the superconductor is made of a metallic material, the improvement comprising:

said tunnel barrier layer comprising a thin-wall portion formed of an insulator and a thick-wall portion formed of an insulator each having opposite first and second surfaces respectively contacting said first and second electrodes and each extending adjacent each other in a same horizontal plane between said first and second electrodes;

said thick-wall portion having a vertical thickness extending from said first surface thereof to said second surface thereof which is at least twice the vertical thickness extending from said first surface to said second surface that of said thin-wall portion;

said vertical thickness of said thin-wall portion being 5 to 100 Å;

said vertical thickness of said thin-wall portion being such that a tunnel effect is enabled therethrough from said first superconductor electrode to said second superconductor electrode, said vertical thickness of said thick-wall portion being such that a tunnel effect is substantially prohibited therethrough from said first superconductor electrode to said second superconductor electrode and such that an electric capacitance per unit surface area of said thick-wall portion is less than that of said thin-wall portion;

wherein said thin-wall portion along said same horizontal plane is substantially evenly distributed in a cross-sectional pattern within said tunnel barrier layer, said cross-sectional pattern being one of an intermittent pattern and a continuous pattern, and wherein a cross-sectional area along said same horizontal plane of said thin-wall portion is less than that of said thick-wall portion; wherein $0 < l < (\sqrt{S} - \sqrt{S_1})/\sqrt{2\pi}$ and $L_1 \geq L$, wherein S denotes a total combined cross-sectional area in the same horizontal plane of said thin-wall portion and said thick-wall portion, wherein $S_1$ denotes a total cross-sectional area in the same horizontal plane of said thin-wall portion, wherein l denotes a maximum value of a plurality of distances, the plurality of distances respectively being shortest linear distances in the same horizontal plane from all respective arbitrary points on said thick-wall portion to said thin-wall portion, wherein L stands for a total outermost edge length of said tunnel barrier layer in a cross-section along the same horizontal plane, and wherein $L_1$ stands for a total edge length of said thin-wall portion in the cross-section.

2. In a superconducting tunnel junction radiation sensing device having first and second superconductor electrodes and a tunnel barrier layer interposed between said first and second superconductor electrodes, wherein the superconductor is made of a metallic material, the improvement comprising:

said tunnel barrier layer comprising a thin-wall portion formed of an insulator and a thick-wall portion formed of a semiconductor each having opposite first and second surfaces respectively contacting said first and second electrodes and each extending adjacent each other in a same horizontal plane between said first and second electrodes;

said thick-wall portion having a vertical thickness extending from said first surface thereof to said second surface thereof which is at least twice the vertical thickness extending from said first surface to said second surface that of said thin-wall portion;

said vertical thickness of said thin-wall portion being 5 to 100 Å;

said vertical thickness of said thin-wall portion being such that a tunnel effect is enabled therethrough from said first superconductor electrode to said second superconductor electrode, said vertical thickness of said thick-wall portion being such that a tunnel effect is substantially prohibited therethrough from said first superconductor electrode to said second superconductor electrode and such that an electric capacitance per unit surface area of said thick-wall portion is less than that of said thin-wall portion;

wherein said thin-wall portion along said same horizontal plane is substantially evenly distributed in a cross-sectional pattern within said tunnel barrier layer, said cross-sectional pattern being one of an intermittent pattern and a continuous pattern, and wherein a cross-sectional area along said same horizontal plane of said thin-wall portion is less than that of said thick-wall portion; wherein $0 < l < (\sqrt{S} - \sqrt{S_1})/\sqrt{2\pi}$ and $L_1 \geq L$, wherein S denotes a total combined cross-sectional area in the same horizontal plane of said thin-wall portion and said thick-wall portion, wherein $S_1$ denotes a total cross-sectional area in the same horizontal plane of said thin-wall portion, wherein l denotes a maximum value of a plurality of distances, the plurality of distances respectively being shortest linear distances in the same horizontal plane from all respective arbitrary points on said thick-wall portion to said thin-wall portion, wherein L stands for a total outermost edge length of said tunnel barrier layer in a cross-section along the same horizontal plane, and wherein $L_1$ stands for a total edge length of said thin-wall portion in the cross-section.

3. In a device as recited in claim 1 or 2, wherein said vertical thickness of said thick-wall portion is at least five times said vertical thickness of said thin-wall portion, and wherein said vertical thickness of said thin-wall portion is 5 to 30 Å.

4. In a device as recited in claims 1 or 2, the improvement further comprising:
said first superconductor electrode comprising a polycrystalline superconductive layer formed along at least said first surface of said thin-wall part, and a single-crystal superconductive layer formed along at least said polycrystalline superconductive layer;
said single-crystal superconductive layer having a vertical thickness which is at least twice a vertical thickness of said polycrystalline superconductive layer;
wherein said insulator of said thin-wall portion is formed of a substance which is not an oxide of said polycrystalline superconductive layer.

5. In a superconducting tunnel junction radiation sensing device having first and second superconductor electrodes and a tunnel barrier layer interposed between said first and second superconductor electrodes, wherein the superconductor is made of a metallic material, the improvement comprising:
said tunnel barrier layer comprising a thin-wall portion formed of a semiconductor and a thick-wall portion formed of a semiconductor each having opposite first and second surfaces respectively contacting said first and second electrodes and each extending adjacent each other in a same horizontal plane between said first and second electrodes;
said thick-wall portion having a vertical thickness extending from said first surface thereof to said second surface thereof which is at least twice the vertical thickness extending from said first surface to said second surface that of said thin-wall portion;
said vertical thickness of said thin-wall portion being 5 to 1000 Å;
said vertical thickness of said thin-wall portion being such that a tunnel effect is enabled therethrough from said first superconductor electrode to said second superconductor electrode, said vertical thickness of said thick-wall portion being such that a tunnel effect is substantially prohibited therethrough from said first superconductor electrode to said second superconductor electrode and such that an electric capacitance per unit surface area of said thick-wall portion is less than that of said thin-wall portion;
wherein said thin-wall portion along said same horizontal plane is substantially evenly distributed in a cross-sectional pattern within said tunnel barrier layer, said cross-sectional pattern being one of an intermittent pattern and a continuous pattern, and wherein a cross-sectional area along said same horizontal plane of said thin-wall portion is less than that of said thick-wall portion; wherein $0 < l < (\sqrt{S} - \sqrt{S_1})/\sqrt{2\pi}$ and $L_1 \geq L$, wherein S denotes a total combined cross-sectional area in the same horizontal plane of said thin-wall portion and said thick-wall portion, wherein $S_1$ denotes a total cross-sectional area in the same horizontal plane of said thin-wall portion, wherein l denotes a maximum value of a plurality of distances, the plurality of distances respectively being shortest linear distances in the same horizontal plane from all respective arbitrary points on said thick-wall portion to said thin-wall portion, wherein L stands for a total outermost edge length of said tunnel barrier layer in a cross-section along the same horizontal plane, and wherein $L_1$ stands for a total edge length of said thin-wall portion in the cross-section.

6. In a superconducting tunnel junction radiation sensing device having first and second superconductor electrodes and a tunnel barrier layer interposed between said first and second superconductor electrodes, wherein the superconductor is made of a metallic material, the improvement comprising:
said tunnel barrier layer comprising a thin-wall portion formed of a semiconductor and a thick-wall portion formed of an insulator each having opposite first and second surfaces respectively contacting said first and second electrodes and each extending adjacent each other in a same horizontal plane between said first and second electrodes;
said thick-wall portion having a vertical thickness extending from said first surface thereof to said second surface thereof which is at least twice the vertical thickness extending from said first surface to said second surface that of said thin-wall portion;
said vertical thickness of said thin-wall portion being 5 to 1000 Å;
said vertical thickness of said thin-wall portion being such that a tunnel effect is enabled therethrough from said first superconductor electrode to said second superconductor electrode, said vertical thickness of said thick-wall portion being such that a tunnel effect is substantially prohibited therethrough from said first superconductor electrode to said second superconductor electrode and such that an electric capacitance per unit surface area of said thick-wall portion is less than that of said thin-wall portion;
wherein said thin-wall portion along said same horizontal plane is substantially evenly distributed in a cross-sectional pattern within said tunnel barrier layer, said cross-sectional pattern being one of an intermittent pattern and a continuous pattern, and wherein a cross-sectional area along said same horizontal plane of said thin-wall portion is less than that of said thick-wall portion; wherein $0 < l < (\sqrt{S} - \sqrt{S_1})/\sqrt{2\pi}$ and $L_1 \geq L$, wherein S denotes a total combined cross-sectional area in the same horizontal plane of said thin-wall portion and said thick-wall portion, wherein $S_1$ denotes a total cross-sectional area in the same horizontal plane of said thin-wall portion, wherein l denotes a maximum value of a plurality of distances, the plurality of distances respectively being shortest linear distances in the same horizontal plane from all respective arbitrary points of said thick-wall portion to said thin-wall portion, wherein L stands for a total outermost edge length of said tunnel barrier layer in a cross-section along the same horizontal plane, and wherein $L_1$ stands for a total edge length of said thin-wall portion in the cross-section.

7. In a device as recited in claim 5 or 6, wherein said vertical thickness of said thick-wall portion is at least five times said vertical thickness of said thin-wall portion, and wherein said vertical thickness of said thin-wall portion is 10 to 100 Å.

8. In a device as recited in claims 5 or 6, the improvement further comprising:
said first superconductor electrode comprising a polycrystalline superconductive layer formed along at least said first surface of said thin-wall part, and a single-crystal superconductive layer formed along at least said polycrystalline superconductive layer;
said single-crystal superconductive layer having a vertical thickness which is at least twice a vertical thickness of said polycrystalline superconductive layer;
wherein said insulator of said thin-wall portion is formed of a substance which is not an oxide of said polycrystalline superconductive layer.

9. In a superconducting tunnel junction radiation sensing device having a first electrode formed of a superconductor and a second electrode formed of a semiconductor and a tunnel barrier layer interposed between said first and second electrodes, wherein the superconductor is made of a metallic material, the improvement comprising:
said tunnel barrier layer comprising a thin-wall portion formed of an insulator and a thick-wall portion formed of an insulator each having opposite first and second surfaces respectively contacting said first and second electrodes and each extending adjacent each other in a same horizontal plane between said first and second electrodes;
said thick-wall portion having a vertical thickness extending from said first surface thereof to said second surface thereof which is at least twice the vertical thickness extending from said first surface to said second surface that of said thin-wall portion;
said vertical thickness of said thin-wall portion being 5 to 100 Å;
said vertical thickness of said thin-wall portion being such that a tunnel effect is enabled therethrough from said first electrode to said second electrode, said vertical thickness of said thick-wall portion being such that a tunnel effect is substantially prohibited therethrough from said first electrode to said second electrode and such that an electric capacitance per unit surface area of said thick-wall portion is less than that of said thin-wall portion;
wherein said thin-wall portion along said same horizontal plane is substantially evenly distributed in a cross-sectional pattern within said tunnel barrier layer, said cross-sectional pattern being one of an intermittent pattern and a continuous pattern, and wherein a cross-sectional area along said same horizontal plane of said thin-wall portion is less than that of said thick-wall portion; wherein $0 < l < (\sqrt{S} - \sqrt{S_1})/\sqrt{2\pi}$ and $L_1 \geq L$, wherein S denotes a total combined cross-sectional area in the same horizontal plane of said thin-wall portion and said thick-wall portion, wherein $S_1$ denotes a total cross-sectional area in the same horizontal plane of said thin-wall portion, wherein l denotes a maximum value of a plurality of distances, the plurality of distances respectively being shortest linear distances in the same horizontal plane from all respective arbitrary points on said thick-wall portion to said thin-wall portion, wherein L stands for a total outermost edge length of said tunnel barrier layer in a cross-section along the same horizontal plane, and wherein $L_1$ stands for a total edge length of said thin-wall portion in the cross-section.

10. In a superconducting tunnel junction radiation sensing device having a first electrode formed of a superconductor and a second electrode formed on a semiconductor and a tunnel barrier layer interposed between said first and second electrodes, wherein the superconductor is made of a metallic material, the improvement comprising:
said tunnel barrier layer comprising a thin-wall portion formed of an insulator and a thick-wall portion formed of a semiconductor each having opposite first and second surfaces respectively contacting said first and second electrodes and each extending adjacent each other in a same horizontal plane between said first and second electrodes;
said thick-wall portion having a vertical thickness extending from said first surface thereof to said second surface thereof which is at least twice the vertical thickness extending from said first surface to said second surface that of said thin-wall portion;
said vertical thickness of said thin-wall portion being 5 to 100 Å;
said vertical thickness of said thin-wall portion being such that a tunnel effect is enabled therethrough from said first electrode to said second electrode, said vertical thickness of said thick-wall portion being such that a tunnel effect is substantially prohibited therethrough from said first electrode to said second electrode and such that an electric capacitance per unit surface area of said thick-wall portion is less than that of said thin-wall portion;
wherein said thin-wall portion along said same horizontal plane is substantially evenly distributed in a cross-sectional pattern within said tunnel barrier layer, said cross-sectional pattern being one of an intermittent pattern and a continuous pattern, and wherein a cross-sectional area along said same horizontal plane of said thin-wall portion is less than that of said thick-wall portion; wherein $0 < l < (\sqrt{S} - \sqrt{S_1})/\sqrt{2\pi}$ and $L_1 \geq L$, wherein S denotes a total combined cross-sectional area in the same horizontal plane of said thin-wall portion and said thick-wall portion, wherein $S_1$ denotes a total cross-sectional area in the same horizontal plane of said thin-wall portion, wherein l denotes a maximum value of a plurality of distances, the plurality of distances respectively being shortest linear distances in the same horizontal plane from all respective arbitrary points on said thick-wall portion to said thin-wall portion, wherein L stands for a total outermost edge length of said tunnel barrier layer in a cross-section along the same horizontal plane, and wherein $L_1$ stands for a total edge length of said thin-wall portion in the cross-section.

11. In a device as recited in claim 9 or 10, wherein said vertical thickness of said thick-wall portion is at least five times said vertical thickness of said thin-wall portion, and wherein said vertical thickness of said thin-wall portion is 5 to 30 Å.

12. In a device as recited in claims 9 or 10, the improvement further comprising:
said first superconductor electrode comprising a polycrystalline superconductive layer formed along at least said first surface of said thin-wall part, and a single-crystal superconductive layer formed along at least said polycrystalline superconductive layer;
said single-crystal superconductive layer having a vertical thickness which is at least twice a vertical thickness of said polycrystalline superconductive layer;
wherein said insulator of said thin-wall portion is formed of a substance which is not an oxide of said polycrystalline superconductive layer.

13. In a superconducting tunnel junction radiation sensing device having a first electrode formed of a superconductor and a second electrode formed of a semiconductor and a tunnel barrier layer interposed between said first and second electrodes, wherein the superconductor is made of a metallic material, the improvement comprising:
said tunnel barrier layer comprising a thin-wall portion and a thick-wall portion each formed of a semiconductor and each having opposite first and second surfaces respectively contacting said first and second electrodes and each extending adjacent each other in a same horizontal plane between said first and second electrodes;
said thick-wall portion having a vertical thickness extending from said first surface thereof to said second surface thereof which is at least twice the vertical thickness extending from said first surface to said second surface that of said thin-wall portion;
said vertical thickness of said thin-wall portion being 5 to 1000 Å;
said vertical thickness of said thin-wall portion being such that a tunnel effect is enabled therethrough from said first electrode to said second electrode, said vertical thickness of said thick-wall portion being such that a tunnel effect is substantially prohibited therethrough from said first electrode to said second electrode and such that an electric capacitance per unit surface area of said thick-wall portion is less than that of said thin-wall portion; wherein said thin-wall portion along said same horizontal plane is substantially evenly distributed in a cross-sectional pattern within said tunnel barrier layer, said cross-sectional pattern being one of an intermittent pattern and a continuous pattern, and wherein a cross-sectional area along said same plane of said thin-wall portion is less than that of said thick-wall portion; wherein $0 < l < (\sqrt{S} - \sqrt{S_1})/\sqrt{2\pi}$ and $L_1 \geq L$, wherein S denotes a total combined cross-sectional area in the same horizontal plane of said thin-wall portion and said thick-wall portion, wherein $S_1$ denotes a total cross-sectional area in the same horizontal plane of said thin-wall portion, wherein $l$ denotes a maximum value of a plurality of distances, the plurality of distances respectively being shortest linear distances in the same horizontal plane from all respective arbitrary points on said thick-wall portion to said thin-wall portion, wherein L stands for a total outermost edge length of said tunnel barrier layer in a cross-section along the same horizontal plane, and wherein $L_1$ stands for a total edge length of said thin-wall portion in the cross-section.

14. In a superconducting tunnel junction radiation sensing device having a first electrode formed of a superconductor and a second electrode formed of a semiconductor and a tunnel barrier layer interposed between said first and second electrodes, wherein the superconductor is made of a metallic material the improvement comprising:
said tunnel barrier layer comprising a thin-wall portion formed of a semiconductor and a thick-wall portion formed of an insulator each having opposite first and second surfaces respectively contacting said first and second electrodes and each extending adjacent each other in a same horizontal plane between said first and second electrodes;
said thick-wall portion having a vertical thickness extending from said first surface thereof to said second surface thereof which is at least twice the vertical thickness extending from said first surface to said second surface that of said thin-wall portion;
said vertical thickness of said thin-wall portion being 5 to 1000 Å;
said vertical thickness of said thin-wall portion being such that a tunnel effect is enabled therethrough from said first electrode to said second electrode, said vertical thickness of said thick-wall portion being such that a tunnel effect is substantially prohibited therethrough from said first electrode to said second electrode and such that an electric capacitance per unit surface area of said thick-wall portion is less than that of said thin-wall portion; wherein said thin-wall portion along said same horizontal plane is substantially evenly distributed in a cross-sectional pattern within said tunnel barrier layer, said cross-sectional pattern being one of an intermittent pattern and a continuous pattern, and wherein a cross-sectional area along said same plane of said thin-wall portion is less than that of said thick-wall portion; wherein $0 < l < (\sqrt{S} - \sqrt{S_1})/\sqrt{2\pi}$ and $L_1 < L$, wherein S denotes a total combined cross-sectional area in the same horizontal plane of said thin-wall portion and said thick-wall portion, wherein $S_1$ denotes a total cross-sectional area in the same horizontal plane of said thin-wall portion, wherein $l$ denotes a maximum value of a plurality of distances, the plurality of distances respectively being shortest linear distances in the same horizontal plane from all respective arbitrary points on said thick-wall portion to said thin-wall portion, wherein L stands for a total outermost edge length of said tunnel barrier layer in a cross-section along the same horizontal plane, and wherein $L_1$ stands for a total edge length of said thin-wall portion in the cross-section.

15. In a device as recited in claim 13 or 14, wherein said vertical thickness of said thick-wall portion is at least five times said vertical thickness of said thin-wall portion, and wherein said vertical thickness of said thin-wall portion is 10 to 100 Å.

16. In a device as recited in claims 13 or 14, the improvement further comprising:
said first superconductor electrode comprising a polycrystalline superconductive layer formed along at least said first surface of said thin-wall part, and a single-crystal superconductive layer formed along at least said polycrystalline superconductive layer;

said single-crystal superconductive layer having a vertical thickness plane which is at least twice a vertical thickness of said polycrystalline superconductive layer;

wherein said insulator of said thin-wall portion is formed of a substance which is not an oxide of said polycrystalline superconductive layer.

17. A superconductive tunnel junction radiation sensing device comprising:

a lower single-crystal superconductive layer, a polycrystalline superconductive layer formed on said lower single-crystal superconductive layer, a tunnel barrier layer formed on said polycrystalline superconductive layer and made of a material which is substantially free of major constituents of a material of said polycrystalline superconductive layer, and an upper superconductive layer formed on said tunnel barrier layer, wherein each of said superconductive layers is made of a metallic material;

said lower single-crystal superconductive layer having a vertical thickness which is at least twice a vertical thickness of said polycrystalline superconductive layer.

18. A superconductive tunnel junction radiation sensing device comprising:

a lower single-crystal superconductive layer, a polycrystalline superconductive layer formed on said lower single-crystal superconductive layer and formed of a same substance as said single-crystal superconductive layer, a tunnel barrier layer formed on said polycrystalline superconductive layer and made of a material which is substantially free of major constituents of a material of said polycrystalline superconductive layer, and an upper superconductive layer formed on said tunnel barrier layer, wherein each of said superconductive layers is made of a metallic material;

said lower single-crystal superconductive layer having a vertical thickness which is at least twice a vertical thickness of said polycrystalline superconductive layer.

19. A superconductive tunnel junction radiation sensing device as recited in claim 18, wherein said lower single-crystal superconductive layer is made of single-crystal Nb, wherein said polycrystalline superconductive layer is made of polycrystalline Nb, wherein said tunnel barrier layer is made of AlOx formed by oxidizing an upper surface region of Al layer formed on said polycrystalline Nb superconductive layer, and wherein said upper superconductive layer is made of polycrystalline Nb.

20. A superconductive tunnel junction radiation sensing device comprising:

a lower single-crystal superconductive layer, a polycrystalline superconductive layer formed on said lower single-crystal superconductive layer, a tunnel barrier layer formed on said polycrystalline superconductive layer and made of a material which is substantially free of major constituents of a material of said polycrystalline superconductive layer, and an upper semiconductor layer formed on said tunnel barrier layer wherein each of said superconductive layers is made of a metallic material;

said lower single-crystal superconductive layer having a vertical thickness which is at least twice a vertical thickness of said polycrystalline superconductive layer.

21. A tunnel Josephson device comprising:

a lower single-crystal superconductive layer having opposite first and second surfaces and having a thickness extending from said first surface to said second surface which is greater than a London penetration depth of a material which forms said lower single-crystal superconductive layer wherein said single-crystal superconductive layer is made of a metallic material;

a polycrystalline superconductive layer formed on said first surface of said lower single-crystal superconductive layer;

a tunnel barrier layer formed on said polycrystalline superconductive layer opposite said lower single-crystal superconductive layer, said tunnel barrier layer being formed of a material which is substantially free of major constituents of a material which forms said polycrystalline superconductive layer; and, an upper superconductive layer formed on said tunnel barrier layer opposite said polycrystalline superconductive layer.

* * * * *